United States Patent
Khoche et al.

(10) Patent No.: US 7,797,599 B2
(45) Date of Patent: Sep. 14, 2010

(54) DIAGNOSTIC INFORMATION CAPTURE FROM LOGIC DEVICES WITH BUILT-IN SELF TEST

(75) Inventors: Ajay Khoche, San Jose, CA (US); Klaus-Dieter Hilliges, Shanghai (CN)

(73) Assignee: Verigy (Singapore) Pte. Ltd., Singapore (SG)

( * ) Notice: Subject to any disclaimer, the term of this patent is extended or adjusted under 35 U.S.C. 154(b) by 542 days.

(21) Appl. No.: 11/535,973

(22) Filed: Sep. 27, 2006

(65) Prior Publication Data

US 2008/0092003 A1 Apr. 17, 2008

(51) Int. Cl.
*G01R 31/28* (2006.01)
(52) U.S. Cl. .................. 714/726; 714/732; 714/736
(58) Field of Classification Search .............. 714/732, 714/733, 734, 724, 726, 727, 729, 736, 738
See application file for complete search history.

(56) References Cited

U.S. PATENT DOCUMENTS

| | | | | |
|---|---|---|---|---|
| 4,503,537 | A * | 3/1985 | McAnney | 714/728 |
| 5,167,020 | A * | 11/1992 | Kahn et al. | 711/119 |
| 6,249,892 | B1 * | 6/2001 | Rajsuman et al. | 714/741 |
| 6,327,685 | B1 * | 12/2001 | Koprowski et al. | 714/733 |
| 6,701,476 | B2 * | 3/2004 | Pouya et al. | 714/727 |
| 7,228,262 | B2 * | 6/2007 | Anzou et al. | 703/14 |
| 7,444,568 | B2 * | 10/2008 | Morrison et al. | 714/726 |
| 7,461,309 | B2 * | 12/2008 | Kiryu | 714/729 |
| 2003/0051197 | A1 * | 3/2003 | Evans | 714/718 |
| 2005/0240850 | A1 * | 10/2005 | Ohwada et al. | 714/726 |
| 2007/0011535 | A1 * | 1/2007 | Anzou et al. | 714/733 |
| 2007/0011537 | A1 * | 1/2007 | Kiryu | 714/733 |
| 2007/0204193 | A1 * | 8/2007 | Grise et al. | 714/733 |

* cited by examiner

*Primary Examiner*—Kevin L Ellis
*Assistant Examiner*—Daniel F McMahon
(74) *Attorney, Agent, or Firm*—Holland & Hart, LLP

(57) ABSTRACT

From a logic device comprising logic circuits and a built-in self-test system (BIST) comprising scan chains, diagnostic information is obtained by using the scan chains to apply a stimulus vector to the logic circuits, to capture responses of the logic circuits to the stimulus vector and to shift the captured responses towards the outputs of the scan chains; generating a representative signature representing the responses output by the scan chains; concurrently storing the responses output by the scan chains temporarily such no more than a most-recently output subset of the responses is stored; determining whether the representative signature is a fault-indicating representative signature; and, when the representative signature is a fault-indicating representative signature, outputting at least some of the stored responses. The output responses are usable as diagnostic information. The most-recently output subset of the responses is composed of fewer than all of the responses generated in response to the stimulus vector.

22 Claims, 10 Drawing Sheets

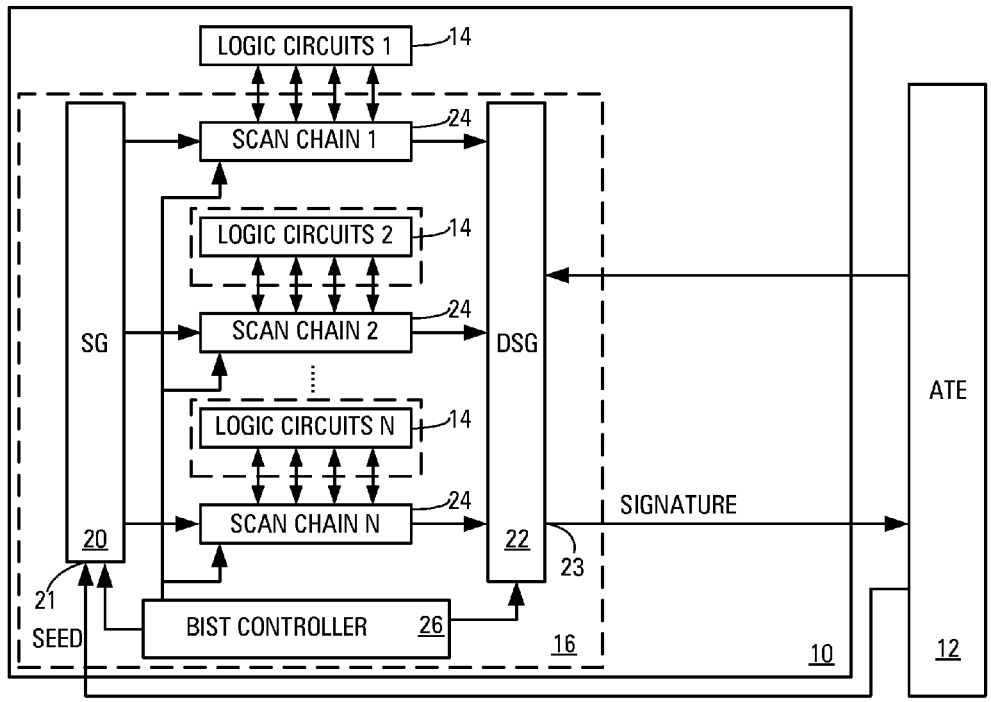
FIG.1A (PRIOR ART)
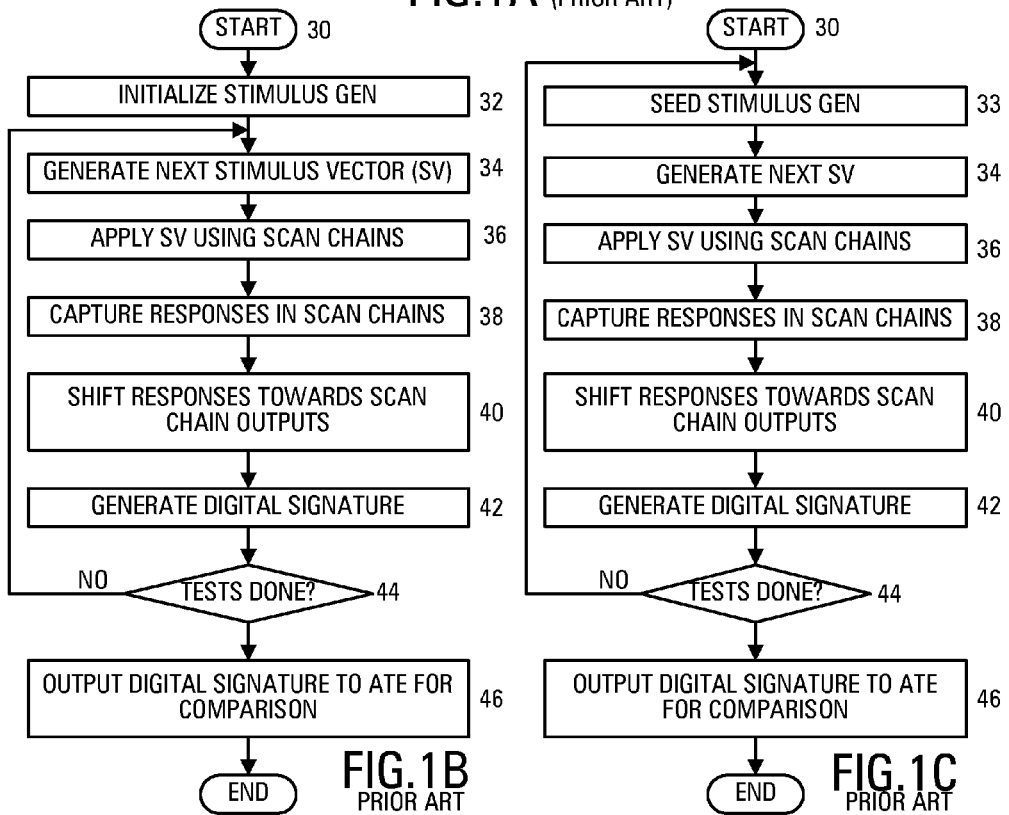
FIG.1B PRIOR ART
FIG.1C PRIOR ART

DIAGNOSTIC INFORMATION CAPTURE FROM LOGIC DEVICES WITH BUILT-IN SELF TEST

RELATED APPLICATIONS

This disclosure is related to the following United States patent applications filed on the filing date of this disclosure: Ser. No. 11/535,974 of Khoche et al. entitled Diagnostic Information Capture from Memory Devices with Built-in Self Test and Ser. No. 11/535,909 of Khoche et al. entitled Automatic Test Equipment Receiving Diagnostic Information from Devices with Built-in Self Test, both of which are assigned to the assignee of this disclosure and are incorporated by reference. This disclosure is also related to the following United States patent application filed on the filing date of this disclosure: Ser. No. 11/535,979 of Khoche et al. entitled Deterministic Diagnostic Information Capture from Memory Devices with Built-in Self Test.

BACKGROUND

The ever-increasing complexity of integrated circuits, especially logic devices, i.e., integrated circuits that comprise logic circuits, has led to logic devices being designed with a built-in self-test system (BIST) to facilitate testing during manufacture. Automatic test equipment (ATE) is still used to test the logic device, but the automatic test equipment simply controls the BIST and evaluates a test result generated by the BIST.

Some built-in test systems use scan chains to convey stimulus vectors from a stimulus source to various parts of the logic device under test and to convey responses from various parts of the logic device under test to a digital signature generator. The digital signature generator performs data compression on the responses generated by each test to generate a single digital signature that represents all the responses generated by the test. The BIST uploads the digital signature to the ATE as the test result for the logic device under test. The ATE compares the digital signature with an expected signature: a difference between the digital signature and the expected signature indicates that the logic device under test is faulty. The response compression process substantially reduces the data flow from the BIST to the ATE but only allows the ATE to determine whether the logic device under test as a whole has passed or failed the test. The response compression process prevents the ATE from identifying the portion of the logic device under test that has caused the logic device under test as a whole to fail the test. Such information is highly desirable, especially to allow process optimization during production ramp-up but also during on-going production to facilitate process control.

FIG. 1A is a block diagram of an example of a logic device under test 10 being tested by automatic test equipment 12. Logic device 10 comprises logic circuits 14 and an example of a built-in self-test system (BIST) 16. BIST 16 is a pseudo-random BIST or any other deterministic BIST, including any BIST that employs reseeding techniques. Examples of commercially-available BISTs include those sold by Synopsys, Inc., Mountain View, Calif. under the name SoCBIST, and those sold by Mentor Graphics Corp., Wilsonville, Oreg. under the registered trademark TestKompress.

The example of BIST 16 shown is composed of a stimulus generator (SG) 20, a digital signature generator (DSG) 22, scan chains 24 and a BIST controller 26. Stimulus generator 20 has a seed input 21 via which it receives a seed from ATE 12. Digital signature generator 22 has a digital signature output 23 from which it outputs the digital signature it generates to ATE 12 at the end of the testing. Each of the scan chains 24 extends between stimulus generator 20 and digital signature generator 22 and is additionally connected to at least one of the logic circuits 14. BIST controller 26 controls the operation of the remaining elements of BIST 16.

In operation, BIST 16 performs a sequence of tests to test logic device under test 10. During the sequence of tests, ATE 12 provides a seed to the seed input 21 of stimulus generator 20 and stimulus generator 20 generates a sequence of stimulus vectors based the seed. Typically, stimulus generator 20 is a linear feedback shift register (LFSR). Stimulus generator 20 outputs each stimulus vector in the sequence of stimulus vectors to the inputs of scan chains 24. Scan chains 24 apply the stimulus vectors to logic circuits 14. The logic circuits generate respective responses to each stimulus vector. Scan chains 24 capture the responses and shift the responses towards digital signature generator 24. In the example shown, digital signature generator 22 is a multiple input shift register (MISR). In other embodiments, digital signature generator 22 is embodied as a combinatorial network known as an X-Compactor. Digital signature generator 22 generates a digital signal in response to the responses output by all the scan chains over the test sequence. The digital signature represents the response of device under test 10 to the stimulus vectors input during the test sequence. At the end of the test sequence, BIST 16 outputs the digital signature to ATE 12, which compares the digital signature with an expected signature for the test sequence. Any mismatch between the digital signature and the expected signature indicates that device under test 10 is faulty.

FIGS. 1B and 1C are flow charts illustrating the operation of a pseudo-random embodiment and a deterministic embodiment, respectively, of BIST 16 described above with reference to FIG. 1A. Referring first to FIG. 1B, execution begins at block 30. In block 32, stimulus generator 20 is initialized with a seed received from ATE 12. In block 34, a next stimulus vector (SV) is generated. In block 36, the stimulus vector generated in block 34 is applied to logic circuits 14 by scan chains 24. In block 38, the responses generated by logic circuits 14 in response to the stimulus vector are captured by scan chains 24. In block 40, the responses captured by the scan chains are shifted towards the outputs of the scan chains, and, after each shift operation, the responses output from the scan chains are input to digital signature generator 22. In block 42, digital signature generator 22 generates a digital signature from the responses it receives from scan chains 24 during the test sequence. In block 44, a test is performed to determine whether all the tests in the test sequence have been performed. A NO result in block 44 returns execution to block 34. A YES result in block 44 advances execution to block 46, where the digital signature generated by digital signature generator 22 is output to ATE 12 for comparison with an expected signature. A difference between the digital signature output to the ATE in block 46 and the expected signature indicates that logic device under test 10 is faulty. However, such difference gives no indication as to the location of the fault in device under test 10.

The flow chart shown in FIG. 1C is substantially the same as the flow chart just described with reference to FIG. 1B, except that, in block 33, stimulus generator 20 is initialized with a new seed provided by ATE 12 for every test, and a NO result in block 42 returns execution to block 33 instead of to block 34.

In either of the flow charts described above with reference to FIGS. 1B and 1C, the digital signature generated by the test sequence is output to ATE 12 after the entire test sequence has been performed, i.e., all the stimulus vectors have been applied to device under test 10 and all the responses have contributed to the digital signature. The number of test cycles needed to apply all the stimulus vectors and to output all the responses is known in advance. Hence, ATE 12 can be programmed to receive the digital signature generated by digital signature generator 22 after the predetermined number of test cycles has been performed.

While the above-described way of capturing the responses and providing them to the ATE for comparison allows the ATE to operate deterministically, it also results in a loss of diagnostic information. Specifically, outputting the digital signature generated by digital signature generator 22 at the end of the test sequence loses information indicating the exact time at which device under test 10 generated each fault-indicating response. This precludes identifying the test cycle in which the device under test generated the fault-indicating response. Moreover, representing all the responses with a digital signature precludes identifying the scan chain and the cell responsible for the fault-indicating response. As noted above, such diagnostic information is highly important during production ramp and is important during on-going production. Dividing the test sequence executed by BIST 16 into sections known as windows does not remedy this shortcoming without additional testing, which is undesirable.

Conventional BISTs such as those described above do not allow the ATE to react to a fault-indicating response. The ATE has no indication that the device under test has generated a fault-indicating response until the end of the test sequence or the end of the window. Moreover, information regarding the fault-indicating response is lost as the BIST continues to operate after a fault-indicating response has been output to digital signature generator 22.

As noted above, digital signature generator 22 may alternatively be embodied as an X-Compactor. Generating the digital signature using an X-Compactor guarantees that a fault-indicating response output by one of the scan chains will be detected at one of the outputs of the X-compactor even in the presence of unknown states on the outputs of the other scan chains. Unlike in the example of BIST 16 described above with reference to FIG. 1A, in which a multi-input shift register is used as digital signature generator 22, in a BIST in which an X-Compactor is used as digital signature generator 22, comparing the digital signature output by the X-Compactor with an expected signature provides an immediate indication that one of the scan chains 24 has output a fault-indicating response. In other words, an X-Compactor used as digital signature generator 22 does not suffer the latency of an MISR. On the other hand, to communicate the digital signature generated an X-Compactor used as digital signature generator 22 to ATE 12 typically requires more communication channels between logic device under test 10 and ATE 12 than the number of communication channels needed when a MISR is used as digital signature generator 22. Increasing the number of communication channels is generally undesirable. Moreover, since the X-Compactor generates a digital signature from the responses output by scan chains 24, the scan chain responsible for the fault-indicating response cannot be identified.

Accordingly, what is needed is a way to obtain diagnostic information from a logic circuit under test having a built-in self-test system.

BRIEF DESCRIPTION OF THE DRAWINGS

FIG. 1A is a block diagram showing an example of a conventional logic device under test with a built-in self test system (BIST) being tested by conventional automatic test equipment.

FIGS. 1B and 1C are flow charts illustrating the operation of a pseudo-random embodiment and a deterministic embodiment, respectively, of the conventional BIST shown in FIG. 1A.

DETAILED DESCRIPTION

Figure 2:
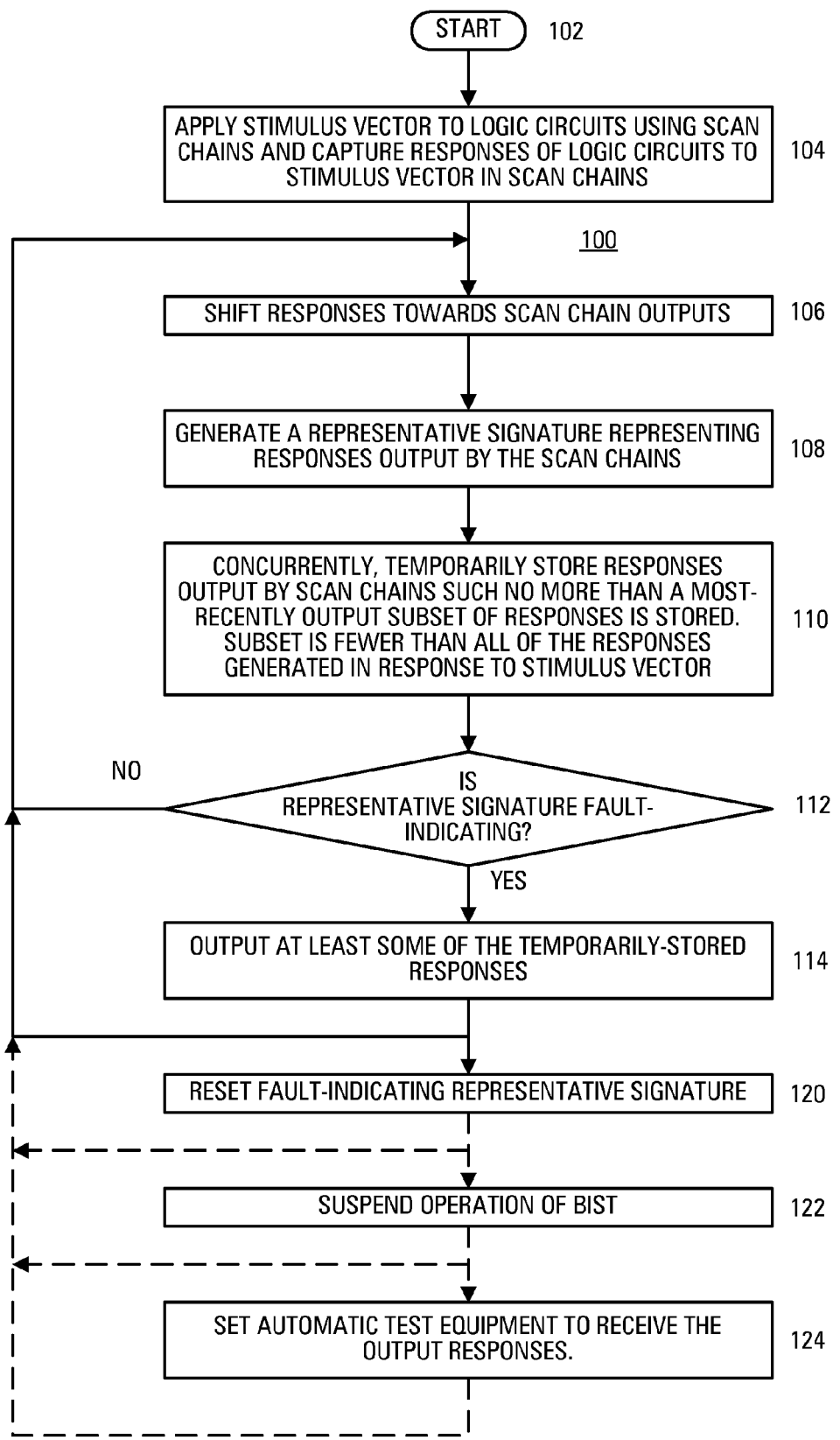
FIG. 2 is a flow chart showing an example of a method in accordance with an embodiment of the invention for obtaining diagnostic information from a logic device comprising logic circuits and having a built-in self-test system (BIST) with scan chains.

FIG. 2 is a flow chart showing an example of a method 100 in accordance with an embodiment of the invention for obtaining diagnostic information from a logic device comprising logic circuit and having a built-in self-test system (BIST) with scan chains. Execution starts at block 102. In block 104, a stimulus vector is applied to the logic circuits using the scan chains and the responses of the logic circuits to the stimulus vector are captured in the scan chains. In block 106, the responses to the stimulus vector are shifted towards the outputs of the scan chains. In block 108, a representative signature is generated representing the responses output by the scan chains. In a typical embodiment, the representative signature is at least part of an underlying digital signature generated as described above from the responses output by the scan chains. Concurrently, in block 110, the responses output by the scan chains are temporarily stored such that a most-recently output subset of the responses output by the scan chains is stored. The most-recently output subset is fewer than all of the responses generated by the logic circuits in response to the stimulus vector.

In block 112, a test is performed to determine whether the representative signature generated in block 108 is a fault-indicating representative signature. A NO result causes execution to return to block 106, where the scan chains perform another output shift operation. A YES result causes execution to advance to block 114.

In block 114, at least some of the temporarily-stored responses are output. The temporarily-stored responses that are output in block 114 are responses that can be used to identify the cell responsible for the fault and the nature of the fault. Following the output of the temporarily-stored responses, execution returns to block 106, described above.

Method 100 is performed by a diagnostic information collector built into the logic device under test. Examples of such diagnostic information collector will be described below. In some embodiments, few, if any, additional communication channels are needed between the logic device under test and host automatic test equipment that tests the logic device under test. Moreover, the number of responses temporarily stored in the diagnostic information collector is relatively low and can therefore be stored in a relatively small buffer memory that constitutes part of the diagnostic information collector.

Unlike the conventional test processes described above with reference to FIGS. 1B and 1C, embodiments of method 100 in accordance with the invention include block 112. In block 112, the representative signature generated after each output shift operation performed by the scan chains in block 106 is tested to determine whether the representative signature (RS) is a fault-indicating representative signature. However, due to the latency inherent in many of the representative signature generation processes that can be used in block 108 to generate the representative signature, a considerable number of output shift operations may occur before a fault-indicating response output by one of the scan chains in block 106 causes a fault-indicating representative signature to be detected in block 112. To preserve the fault-indicating response so that it can later be used as diagnostic information, a most-recently output subset of the responses is temporarily stored in block 110. The most-recently output subset of the responses is composed of the responses output by the scan chains in at least the number of output shift operations corresponding to the maximum latency of the representative signature generation process performed in block 108. This is fewer than all of the responses generated in response to the stimulus vector applied to the logic circuits in block 104, which keeps the amount of memory needed for the storage reasonable.

The flow diagram shown in FIG. 2 additionally shows some operations that optionally can constitute part of embodiments of method 100. Such operations are performed in addition to the response output performed in block 114 when a YES result is obtained in block 112, i.e., when the representative signature generated in block 108 is a fault-indicating representative signature. The additional operations need not be performed in the order shown.

The logic device under test may have more than one fault. When testing such a device under test, the first fault detected causes a YES result in block 112, which causes block 114 to be performed. Subsequently, performance of method 100 is resumed and is typically continued until all the responses have been shifted out of the scan chains and all the tests in the test sequence have been performed. However, because the responses output by the scan chains in more than one output shift operation are effectively combined in the representative signature generation process performed in block 108, the fault-indicating response that caused the YES result in block 112 continues to contaminate the subsequently-generated representative signatures. This would lead to the subsequently-generated representative signatures indicating faults where none exist. To prevent this occurrence, the representative signature generation is reset in block 120. In the reset operation, the fault-indicating digital signature underlying the fault-indicating representative signature is overwritten by a corrected digital signature in which the fault-indicating response is corrected. Execution of method 100 then continues.

In the example shown, a YES result in block 112 automatically prevents output shift block 106 from being performed again until response output block 114 has been completed. In other embodiments of method 100, a YES result in block 112 does not automatically prevent the scan chains from performing additional output shift operations. Such embodiments can include block 122 when it is desired to minimize the size of the most-recently output subset of the responses, i.e., the responses stored in block 110, and, hence, to minimize the size of the response storage. In block 122, the operation of the BIST is temporarily suspended when a YES result is obtained in block 112. This prevents the scan chains from outputting more responses and eliminates the need to store such responses in block 110 during the response output operation performed in block 114. Operation of the BIST is typically suspended at least for the duration of the response output operation performed in block 114.

A logic device under test that performs an embodiment of method 100 is typically connected to automatic test equipment (ATE). The ATE provides a seed to the stimulus generator at least at the start of the test sequence, determines whether the logic device under test has passed or failed the test sequence and receives the diagnostic information output in block 114. Such ATE differs from conventional ATE in that it is capable of behaving non-deterministically. Such capability enables it, at any point in the test sequence, to suspend its normal testing operations and receive the diagnostic information output in block 114. Some embodiments of method 100 that output the diagnostic information to such non-deterministic ATE comprise block 124 in which the ATE is set to receive the responses output in block 114. In an embodiment, a fault indication is provided to the ATE in block 124 indicating that a fault has been detected and diagnostic information is available for output to the ATE. The ATE periodically checks for the presence of the fault indication and executes a diagnostic information receiving routine when it determines that the fault indication is present. In another embodiment, the fault indication provided to the ATE in block 124 operates as an interrupt that immediately causes the ATE to suspend its normal testing operations and execute a diagnostic information receiving routine in which it receives the diagnostic information output in block 114. Additional handshaking operations between the diagnostic information collector and the ATE may be performed in connection with the execution of block 124. Such handshaking operations may take a non-trivial time.

The number of responses temporarily stored in block 110 and, hence, the size of the storage in which the responses are stored, depends at least on the maximum latency of the representative signature generation process performed in block 108. The latency of the representative signature generation process is the number of output shift operations performed between a fault-indicating response being output by the scan chains in block 108 and a fault-indicating representative signature being detected in block 112. In an example in which a multiple input shift register (MISR) similar to that described above with reference to FIG. 1A generates the digital signatures underlying the representative signatures from the responses output by the scan chains and in which the representative signatures are each a single bit, the scan chains will perform as many as N output shift operations before a fault-indicating response output by the scan chain most distant from the digital signature output of the MISR (the scan chain labelled scan chain 1 in the example shown in FIG. 1A) will cause the MISR to generate a fault-indicating representative signature, where N is the number of stages in the MISR. In such example, the responses output by at least N output shift operations performed by the scan chains are temporarily stored in block 110 to prevent the diagnostic information provided by the stored fault-indicating response from being overwritten by a subsequent storing operation performed before the output shift operations are stopped by the fault-indicating response finally causing the MISR to generate the fault-indicating representative signature that causes a YES result in block 112. As noted above, the number of responses stored is less than the total number of responses generated in response to the input stimulus vector.

In embodiments of method 100 without block 122 and in which a YES result obtained in block 112 does not automatically stop the scan chains from performing additional output shift operations during the response output operation performed in block 114, the responses output in more than N output shift operations are temporarily stored. This is to allow the responses output during the normal operation of the BIST to be stored during the time taken for block 114 to be performed. As noted above, performing block 114 may take a non-trivial time.

Figure 3:
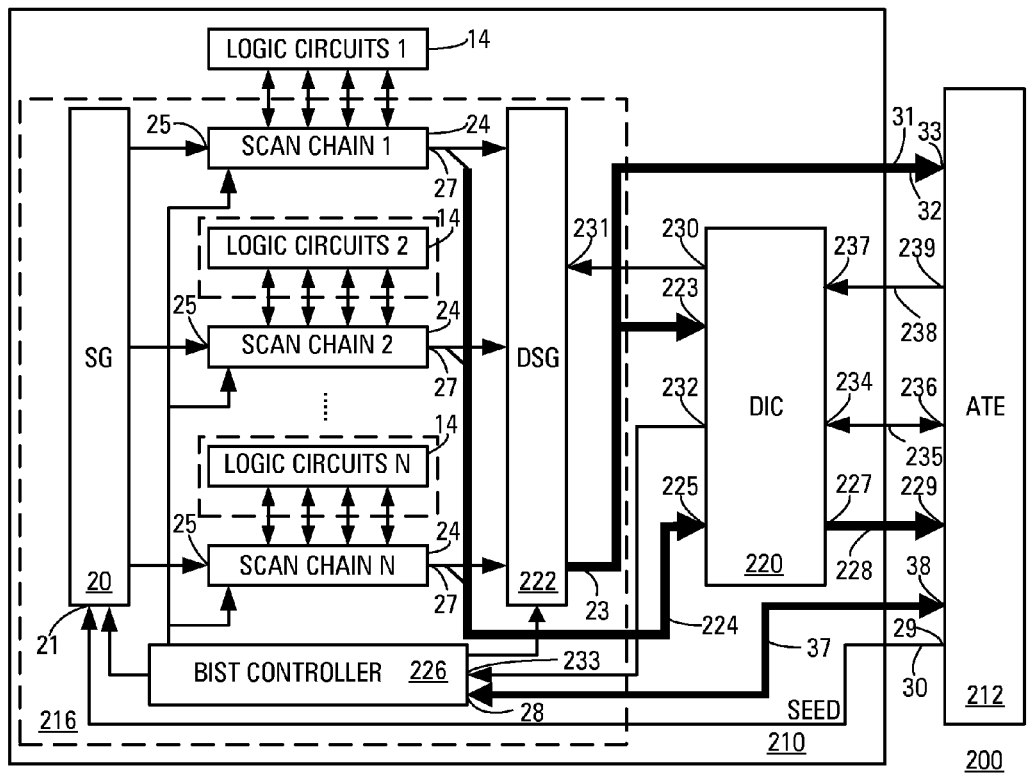
FIG. 3 is a block diagram showing an example of a system and a logic device in accordance with an embodiment of the invention.

FIG. 3 is a block diagram showing an example of a system 200 in accordance with an embodiment of the invention for obtaining diagnostic information from a logic device comprising logic circuits and a built-in self-test system (BIST) with scan chains coupled to the logic circuits. FIG. 3 additionally shows an example of a logic device under test 210 in accordance with an embodiment of the invention. Logic device 210 comprises logic circuits and a BIST with scan chains coupled to the logic circuits, and provides diagnostic information.

System 200 comprises logic device 210 and ATE 212. Logic device 210 comprises logic circuits 14, a built-in self-test system (BIST) 216 and a diagnostic information collector (DIC) 220. Diagnostic information collector 220 has a representative signature input 223, a response input 225, a fault indication port 234 and a diagnostic information output 227.

BIST 216 is a pseudo-random BIST or any other deterministic BIST, including any BIST that employs reseeding techniques. Examples of commercially-available BISTs include those sold by Synopsys, Inc., Mountain View, Calif. under the name SoCBIST, and those sold by Mentor Graphics Corp., Wilsonville, Oreg. under the registered trademark TestKompress.

The example of BIST 216 shown in FIG. 3 comprises a stimulus generator (SG) 20, a digital signature generator (DSG) 222, scan chains 24, a diagnostic information output path 228 and a BIST controller 226.

Stimulus generator 20 has a seed input 21 via which it receives one or more seeds from a seed output 29 of ATE 212 via seed path 30.

Each of the scan chains 24 has an input 25 connected to stimulus generator 20 and an output 27 connected to digital signature generator 222. The output 27 of each of the scan chains 24 is additionally connected to a respective input of a response bus 224. Response bus 224 extends to the response input 225 of diagnostic information collector 220. Points along scan chains 24 are coupled to the logic circuits 14.

Scan chains 24 operate to shift one or more stimulus vectors along the scan chains and to apply the stimulus vectors to logic circuits 14. Scan chains 24 additionally operate to capture from logic circuits 14 the responses generated by the logic circuits in response to each stimulus vector and to shift the captured responses towards digital signature generator 222 and response bus 224 connected to the outputs 27 of the scan chains.

Digital signature generator 222 has a digital signature output 23 and additionally has a respective input connected to the output 27 of each scan chain 24. Digital signature output 23 is internally connected to a test result output 31 of logic device 210. Digital signature generator 222 receives the set of responses output by each output shift operation performed by scan chains 24. After receiving each set of responses, digital signature generator 222 generates a new digital signature and outputs at least part of such digital signature at digital signature output 23 as a respective representative signature. The digital signature and the representative signature depend not only on the set of responses output by the most-recent output shift operation performed by scan chains 24 but also on sets of responses output by previous output shift operations performed by scan chains 24.

The number of bits in each digital signature generated by digital signature generator 222 is typically equal to the number of scan chains 24. After each output shift operation performed by scan chains 24, digital signature generator 222 generates a new digital signature and outputs at least part of such multi-bit digital signature as a representative signature. Diagnostic information collector 220 compares each representative signature output by digital signature generator 222 with a corresponding expected signature to determine whether the representative signature is a fault-indicating representative signature that indicates a fault. In one embodiment, digital signature generator 222 outputs the most-significant bit (MSB) or the least-significant bit (LSB) of each digital signature as a single-bit representative signature and diagnostic information collector 220 compares such single-bit representative signature with a respective single-bit expected signature. In this embodiment, latency between a fault-indicating response being received at the input of digital signature generator 222 and the digital signature generator outputting a resulting single-bit fault-indicating representative signature is a maximum. In terms of output shift operations performed by scan chains 24, the latency of this single-bit embodiment is equal the number of bits in the digital signature generated by digital signature generator 222. In another embodiment, to reduce latency compared with that of using a single-bit representative signature, digital signature generator 222 is provided with taps along its length and outputs multiple representative bits of the digital signature as a multi-bit representative signature. Diagnostic information collector 220 compares such multi-bit representative signature with a respective multi-bit expected signature having an equal number of bits. Latency is minimized by digital signature generator 222 outputting all the bits of each digital signature as the representative signature. Increasing the number of bits in the representative signature reduces latency but potentially increases the demand for communication bandwidth between logic device under test 210 and ATE 212 for the expected signature. The optimum number of bits in the representative signature output by digital signature generator 222 is therefore based on a trade-off between latency and communication bandwidth for given embodiments of logic device 210 and ATE 212.

At the end of the test sequence performed by BIST 216, digital signature generator 222 outputs the entire digital signature to the test result output 31 of logic device under test 210 as a test result for logic device under test 210. Logic device under test 210 has the above-mentioned test result output 31 and digital signature generator 222 provides a test result at test result output 31 at the end of the test sequence to provide compatibility with conventional logic test routines executed by ATE 212. Test result output 31 may be omitted in versions of logic device 210 intended for testing by an embodiment of ATE 212 that executes a modified logic test routine capable of determining a test result for logic device under test 210 without the ATE receiving a test result from the logic device under test itself. For example, using such modified logic device test routine, the ATE can determine a test result for the logic device under test by determining whether it received fault indication FI or whether it received diagnostic information while it was testing the logic device under test.

ATE 212 has a test result input 33, a control port 38, a diagnostic information input 229, a fault indication port 236 and an expected signature information output 239. A test result path 32 connects test result input 33 to test result output 31. Test result input 33 and test result path 32 may be omitted from embodiments of ATE 212 capable of determining a test result for logic device under test 210 without receiving a test result from logic device under test 210.

A control path 37 connects control port 38 to a control port 28 of BIST controller 226. BIST controller 226 controls the operation of BIST 116 in response to control signals provided by ATE 212 via control path 37 and additionally provides status information to ATE 212 via control path 37. A diagnostic information path 228 connects diagnostic information input 229 to the diagnostic information output 227 of diagnostic information collector 220. A fault indication path 235 connects fault indication port 236 to the fault indication port 234 of diagnostic information collector 220. An expected signature information path 238 connects expected signature information output 239 to the expected signature information input 237 of diagnostic information collector 220.

During operation of BIST 216 to test logic device under test 210, stimulus generator 20 generates a stimulus vector and scan chains 24 shift the stimulus vector into logic circuits 14 and apply the stimulus vector to logic circuits 14. Scan chains 24 capture the responses of logic circuits 14 to the stimulus vector and then shift the responses towards their respective outputs. After each output shift operation performed by scan chains 24, digital signature generator 222 generates a representative signature representing the responses received from scan chains 24 and outputs the representative signature to the representative signature input 223 of diagnostic information collector 220. Diagnostic information collector 220 determines whether the representative signature received from digital signature generator 222 is a fault-indicating representative signature. Additionally, diagnostic information collector 220 receives the responses output by scan chains 24 in each output shift operation and temporarily stores the responses such that a most-recently output subset of the responses is stored. The most-recently output subset of the responses is composed of fewer than all of the responses generated by logic circuits 14 in response to the stimulus vector. When the representative signature is a fault-indicating representative signature, diagnostic information collector 220 outputs at least some of the stored responses at diagnostic information output 227. In the example shown, diagnostic information collector 220 outputs the stored responses to the diagnostic information input 229 of ATE 212 via diagnostic information output path 228.

FIG. 3 additionally shows some optional additional elements of system 200 and logic device 210. In the example shown, diagnostic information collector 220 additionally has a corrected signature output 230, a suspend output 232, a fault indication port 234 and an expected signature information input 237. Digital signature generator 222 additionally has a corrected signature input 231 connected to the corrected signature output 230 of diagnostic information collector 220. When the representative signature output by digital signature generator 222 is a fault-indicating representative signature, diagnostic information collector 220 provides at corrected signature output 230 a corrected signature that is used to overwrite or otherwise replace at least part of the underlying digital signature in digital signature generator 222.

BIST controller 226 additionally has a suspend input 233 connected to the suspend output 232 of diagnostic information collector 220. When the representative signature is a fault-indicating representative signature, diagnostic information collector 220 sets the suspend output 232 to a state that causes BIST controller 226 to suspend the operation of BIST 216 while diagnostic information collector outputs 220 the stored diagnostic information. Suspending operation of BIST 216 during the output operation reduces the storage needed to store the responses within diagnostic information collector 220, as described above and as will be described in more detail below.

When the representative signature output by digital signature generator 222 is a fault-indicating representative signature, diagnostic information collector 220 provides a fault indication FI at fault indication port 234. Fault indication FI, when communicated to fault indication port 236, causes ATE 212 to suspend its normal testing operations to receive the stored responses output by diagnostic information collector 220. As noted above, ATE 212 may periodically test whether fault indication FI is present at fault indication port 236. Alternatively, the presence of fault indication FI at fault indication port 236 may act as an interrupt for ATE 212. In an embodiment, ATE 212 additionally signals its readiness to receive the responses from diagnostic information collector 220 via fault indication port 236.

At least at the beginning of each test sequence, ATE 212 provides expected signature information to the expected signature information input 237 of diagnostic information collector 220 via expected signature information path 238. In some embodiments, diagnostic information collector 220 uses the expected signature information itself as the expected signature corresponding to each representative signature output by digital signature generator 222. In other embodiments, diagnostic information collector 220 uses the expected signature information as a seed from which it generates the expected signature corresponding to each representative signature. In all embodiments, diagnostic information collector 220 compares the representative signature output by digital signature generator 222 after each scan chain output shift operation performed by scan chains 24 with the corresponding expected signature to determine whether the representative signature is a fault-indicating representative signature.

Figure 4:
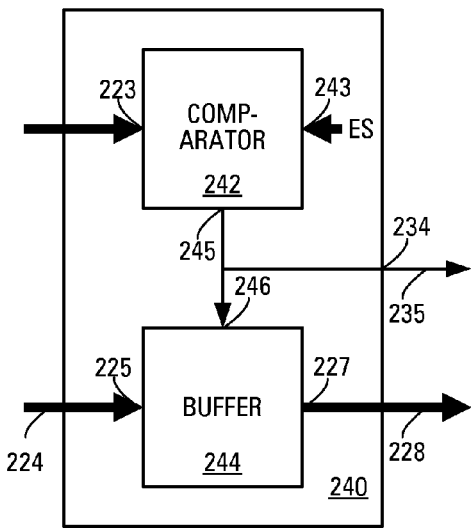
FIG. 4 is a block diagram showing an example of a first embodiment of a diagnostic information collector that may be used as the diagnostic information collector in the logic device shown in FIG. 3.

FIG. 4 is a block diagram showing an example of a minimalist embodiment of a diagnostic information collector 240 that may be used as diagnostic information collector 220 in logic device 210 described above with reference to FIG. 3. Diagnostic information collector 240 will be described with additional reference to FIG. 3. Diagnostic information collector 240 comprises a comparator 242 and a buffer 244.

Comparator 242 has a representative signature input, an expected signature input 243 and an output 245. The representative signature input of comparator 242 provides the representative signature input 223 of diagnostic information collector 240 and receives the representative signature output by digital signature generator 222 after each scan chain output shift operation. Expected signature input 243 is connected to receive an expected signature ES corresponding to each representative signature received at representative signature input 223. As noted above, the expected signature can be the expected signature information itself or the expected signature can be derived from the expected signature information, as will be described in more detail below. Output 245 is connected to the fault indication port 234 of diagnostic information collector 240.

Buffer 244 has a control port 246, a response input and a diagnostic information output. Control port 246 is connected to the output 245 of comparator 242. The response input of buffer 244 provides the response input 225 of diagnostic information collector 240 and is connected to response bus 224. The diagnostic information output of buffer 244 provides the diagnostic information output 227 of diagnostic information collector 240 and is connected to diagnostic information output path 228.

In operation, buffer 244 receives via response input 225 the responses output in each output shift operation performed by scan chains 24 and temporarily stores the responses. Buffer 244 stores the newly-received responses in such a way that the newly-received responses replace the oldest responses stored therein. Typical replacement methods include overwriting the oldest responses stored in the buffer with the newly-received responses and shifting the oldest responses out of the buffer as the newly-received responses are shifted into the buffer. By replacing the oldest responses with the newly-received responses, buffer 244 always temporarily stores the responses output by scan chains 24 in the N most-recently performed output shift operations, where N is less than the total number of output shift operations needed to shift out of the scan chains all of the responses captured from logic circuits 14 in response to a given stimulus vector. By storing only the responses output by scan chains 24 in what is typically a small subset of the total number of output shift operations, the size of buffer 244 can be relatively small. Minimizing the size of buffer 244 is desirable to minimize the cost of incorporating diagnostic information collector 220 in logic device 210. However, the number of tests whose responses are stored in buffer 244 must be sufficient to ensure that, when the output 245 of comparator 242 indicates a fault, the fault-indicating response that caused such fault indication has not been replaced by a response subsequently stored in buffer 244, as discussed above.

Comparator 242 receives via representative signature input 223 the representative signature output by digital signature generator 222 after each scan chain output shift operation. Comparator 242 additionally receives at expected signature input 243 an expected signature ES corresponding to such representative signature. Comparator 242 compares the representative signature with the expected signature. When the representative signature differs from the expected signature, the output 245 of comparator 242 changes to a fault-indicating state. In response to the fault-indicating state, buffer 244 outputs to ATE 212 at least some of the responses stored therein as diagnostic information. The stored responses are output via diagnostic information output 227 and diagnostic information output path 228. Since the fault-indicating response that caused the output of comparator 242 to change to the fault-indicating state exists within the responses output from buffer 244, analysis of the responses output from buffer 244 will reveal the identity and failure mode of the faulty cell in logic circuits 14. Thus, such output responses constitute diagnostic information.

Figure 5:
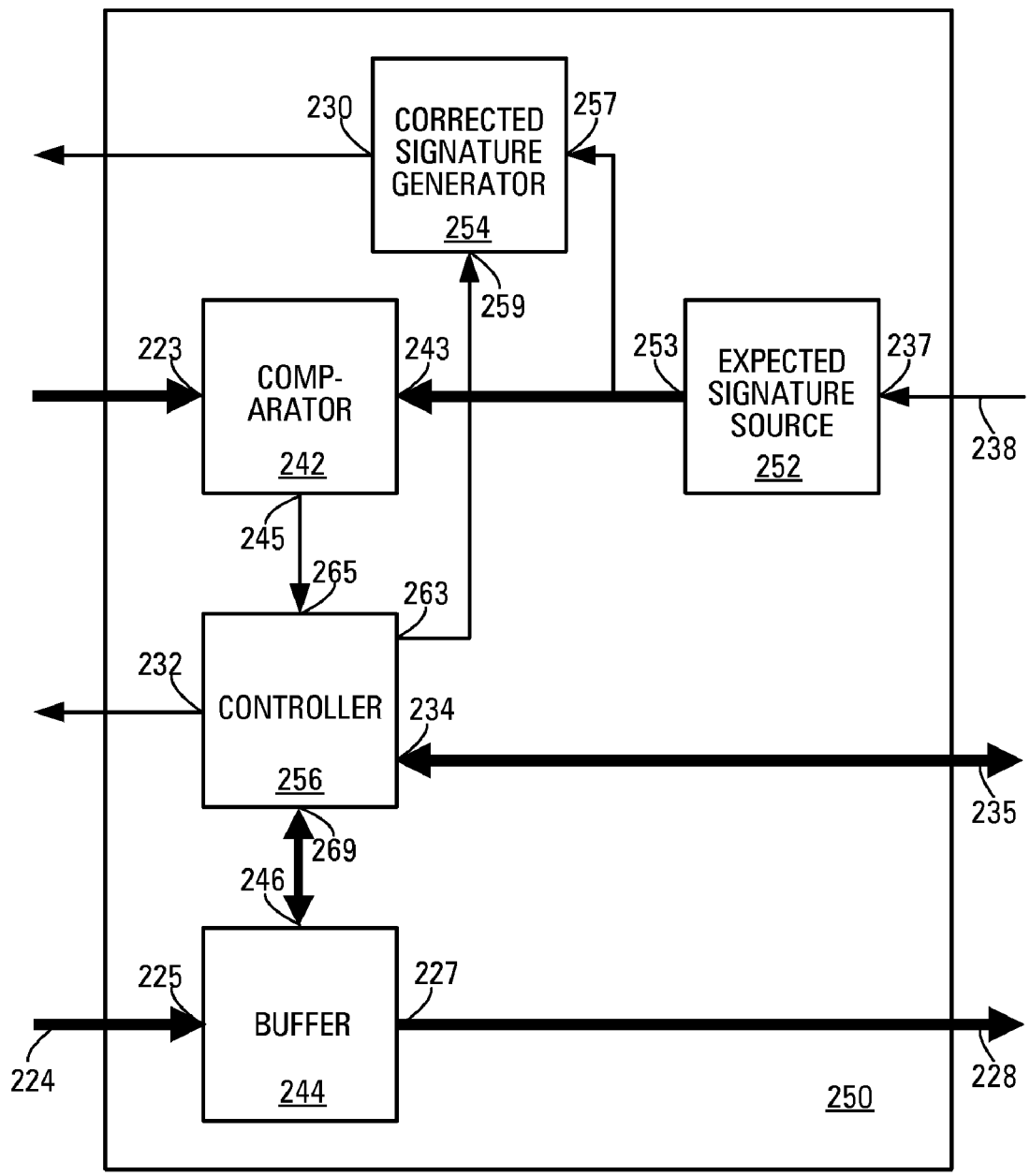
FIG. 5 is a block diagram showing an example of a second embodiment of a diagnostic information collector that may be used as the diagnostic information collector in the logic device shown in FIG. 3.

FIG. 5 is a block diagram showing an example of an embodiment of a diagnostic information collector 250 that may be used as diagnostic information collector 220 in logic device 210 described above with reference to FIG. 3. Diagnostic information collector 250 will be described with additional reference to FIG. 3. Elements of diagnostic information collector 250 that correspond to elements of above-described diagnostic information collector 240 are indicated by the same reference numerals and will not be described in detail again.

Diagnostic information collector 250 comprises comparator 242, buffer 244, an expected signature source 252, a corrected signature generator 254 and a controller 256.

Expected signature source 252 has an expected signature information input and an expected signature output 253. The expected signature information input provides the expected signature information input 237 of diagnostic information collector 250 and is connected to expected signature information path 238. Expected signature output 253 is connected the expected signature input 243 of comparator 242.

Corrected signature generator 254 has an expected signature input 257, a corrected signature output and a control input 259. Expected signature input 257 is connected to the expected signature output 253 of expected signature source 252. The corrected signature output provides the corrected signature output 230 of diagnostic information collector 250.

Controller 256 has a bidirectional fault indication port, a corrected signature control output 263, a fault state input 265, a suspend output and a bidirectional buffer control port. The fault indication port provides the fault indication port 234 of diagnostic information collector 250 and is connected to fault indication path 235. The suspend output provides the suspend output 232 of diagnostic information collector 250. Corrected signature control output 263 is connected to the control input 259 of corrected signature generator 254. Fault state input 265 is connected to the output 245 of comparator 242. Buffer control port 269 is connected to the control port 246 of buffer 244.

The functions of the various inputs, outputs and ports, comparator 242 and buffer 244 of diagnostic information collector 250 are as described above with reference to FIG. 3 and FIG. 4. The functions performed by the remaining blocks constituting diagnostic information collector 250 will be described next.

Expected signature source 252 receives expected signature information from ATE 212 via expected signature information path 238 and expected signature information input 237. In response to the expected signature information, the expected signature source provides to the expected signature input 243 of comparator 242 an expected signature corresponding to each representative signature output by digital signature generator 222. The implementation of expected signature source 252 and the expected signature information received from ATE 212 depend in part on the implementation of comparator 242.

Corrected signature generator 254 operates in response to an activation signal provided to its control input 259 by controller 256 to output a corrected signature in response to an expected signature provided to its expected signature input 257 by expected signature source 252. Corrected signature generator 254 provides the corrected signature to digital signature generator 220 via corrected signature output 230. Corrected signature generator 254 additionally provides to digital signature generator 222 a command signal (not shown) that causes digital signature generator 222 to load the corrected signature. Loading the corrected signature into digital signature generator 222 removes from digital signature generator 222 the digital signature underlying the fault-indicating representative signature that caused the output 245 of comparator 242 to change to the fault-indicating state. This restores the representative signature output by digital signature generator 222 to one that matches the expected signature output by expected signal source 252. This in turn restores the output 245 of comparator 242 to its normal (not fault-indicating) state.

Controller 256 operates in response to the state of the output 245 of comparator 242 to control the operation of diagnostic information collector 250, BIST 216 and ATE 212. In response to the output 245 of comparator 242 indicating a normal (not fault-indicating) state, controller 256 provides to BIST controller 226 via suspend output 232 a suspend signal in a normal state that allows BIST controller 226 to enable BIST 216 perform the sequence of tests constituting the test sequence. Controller 256 additionally provides to corrected signature generator 254 the activation signal in a normal state that inhibits the operation of the corrected signal generator. Controller 256 additionally provides no fault indication FI to ATE 212 via fault indication port 234. The lack of fault indication FI allows ATE 212 to perform normal testing operations. Finally, controller 256 provides to the control port 246 of buffer 244 one or more control signals that cause the buffer to store the responses received from response bus 224 at response input 225 in each output shift operation of scan chains 24.

In response to the output 245 of comparator 242 changing to the fault-indicating state, controller 256 changes the suspend signal provided to BIST controller 226 to a suspend state that causes BIST controller 226 to inhibit temporarily normal operation of BIST 216. This temporarily stops the scan chains 24 performing output shift operations. Controller 256 additionally changes the activation signal provided to corrected signature generator 254 to an activate state that causes corrected signature generator 254 to generate a corrected signature and that causes digital signature generator 222 to overwrite or otherwise replace the digital signature underlying the fault-indicating representative signature with the corrected digital signature. This in turn causes digital signature generator 222 to output a corrected representative signature that restores the output 245 of comparator 242 to its normal (not fault-indicating) state. Controller 256 additionally provides fault indication FI to fault indication port 234. Fault indication FI received at fault indication port 236 changes ATE 212 to a state in which it can receive the stored responses output by diagnostic information collector 250. Typically, controller 256 waits for a ready signal sent by ATE 212 via fault indication port 234 before causing buffer 244 to output the stored responses. The ready signal indicates to controller 256 that ATE is ready to receive the stored responses. On receiving such ready signal, controller 256 provides one or more control signals to buffer 244 to cause the buffer to output the responses stored therein to ATE 212. As noted above, buffer 244 outputs the responses to ATE 212 via diagnostic information output 227, diagnostic information output path 228 and the diagnostic information input 229 of the ATE.

Once the responses have been output from buffer 244, controller 256 restores the suspend, activation, fault indication and other control signals to their original states. This reactivates BIST 216, which restores the flow of responses to response input 225 and the storing of such responses in buffer 244; inhibits corrected signature generator 254; restores ATE 212 to its normal test mode; and resumes the operation of diagnostic information collector 250.

Some of the elements of diagnostic information collector 250 will now be described in more detail.

Comparator 242

Figure 6A:
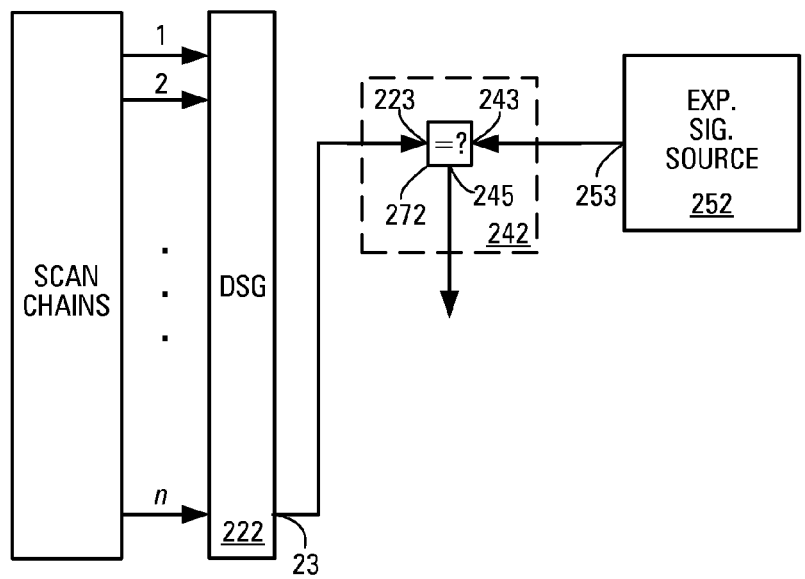
FIG. 6A is a block diagram showing an example of a comparator for use in embodiments of the logic device shown in FIG. 3 in which the representative signature and the expected signature are each a single bit.

In some embodiments of logic device 210, the representative signature output by digital signature generator 222 after each output shift operation performed by scan chains 24 and the corresponding expected signature provided by expected signature source 252 are each a single bit. FIG. 6A is a block diagram showing an example of comparator 242 for use in embodiments of logic device 210 in which the representative signature and the expected signature are each a single bit. In this example, comparator 242 is composed of a single-bit comparator 272. Single-bit comparator 272 has a representative signature input that provides the representative signature input 223 of diagnostic information collector 250, an expected signature input that provides the expected signature input 243 of comparator 242, and an output that provides the output 245 of comparator 242.

Using a single-bit representative signature, as in this example, causes the maximum latency of digital signature generator 222 to be equal to the number of output shift operations performed by scan chains 24 to move a response from the input of digital signature generator 222 most distant from the digital signature output 23 of digital signature generator 222 to digital signature output 23. The latency of digital signature generator 222 is the number of output shift operations between a fault-indicating response being output from one of scan chains 24 and the fault-indicating response causing digital signature generator 222 to output a fault-indicating representative signature. Using a single-bit representative signature also incurs a small but finite probability of error masking occurring in the digital signature generator between responses successively output from scan chains before the fault-indicating representative signature is output.

Figure 6B:
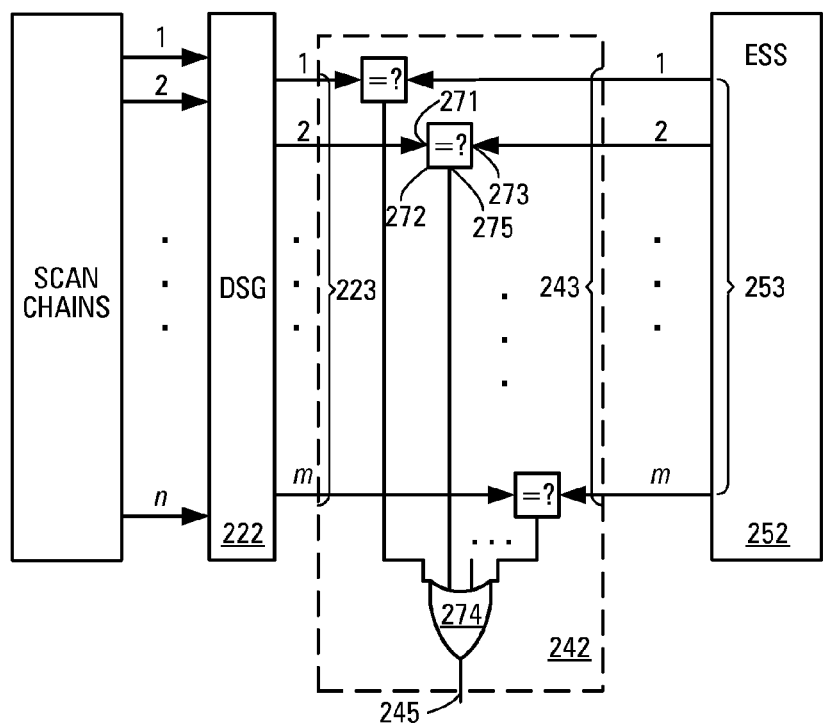
FIG. 6B is a block diagram showing an example of a comparator for use in embodiments of the logic device shown in FIG. 3 in which the representative signature and the expected signature are each multi-bit values.

FIG. 6B is a block diagram showing an example of comparator 242 for use in embodiments of logic device 210 in which the representative signature and the expected signature are each multi-bit values. Embodiments of digital signature generator 222 structured as a multi-tap MISR or as an X-Compactor generate a multi-bit representative signature. In this example, BIST 216 has n scan chains 24 (FIG. 3) and digital signature generator 222 receives the responses output in each output shift operation performed by the n scan chains 24 and has m taps (m≦n) spaced along its length. The representative signature input 223 of diagnostic information collector 250, the expected signature input 243 of comparator 242 and the expected signature output 253 of expected signature source 252 are each composed of conductors (not shown) equal in number to the taps of digital signature generator 222, i.e., m conductors in this example.

This embodiment of comparator 242 comprises m single-bit comparators, an exemplary one of which is shown at 272, and an m-input OR-gate 274. Comparator 272 has a first input 271 connected to a respective one of the taps of digital signature generator 222 via a respective conductor of representative signature input 223, a second input 273 connected to a corresponding conductor of expected signature input 243, and an output 275 connected to a respective input of OR-gate 274. The first input of each of the remaining comparators is connected to a respective tap of digital signature generator 222 via a respective conductor of representative signature input 223, the second input of each of the remaining comparators is connected to corresponding conductor of expected signature input 243, and the output of each of the remaining comparators is connected to a respective input of OR-gate 274 in an arrangement similar to that described above with reference to comparator 272. The output of OR-gate 274 provides the output 245 of comparator 242.

In an embodiment of logic device 210 in which digital signature generator 222 is structured as a multi-tap MISR and comparator 242 is structured as just described, the maximum latency of digital signature generator 222 is n/m output shift operations of scan chains 24, assuming that the taps of digital signature generator 222 are equally spaced. This latency is less than that in the single-bit example described above with reference to FIG. 6A, but is obtained at the cost of providing digital signature generator 222 with m taps and using an m-bit device as expected signature source 252. As will be described below, in some embodiments, using a multi-bit device as expected signature source 252 can increase the number of conductors constituting expected signature information path 238 that extends from ATE 212 to logic device 210. Such an increase in the number of conductor can be undesirable.

An extreme embodiment of digital signature generator 222 comprises an MISR in which m and n are equal. The latency of such embodiment of digital signature generator 222 is reduced to one output shift operation at the expense of expected signature source 252 being an n-bit device and expected signature information path 238 having n conductors. However, this embodiment does not eliminate the need to store the responses in buffer 244 because of the remaining one output shift operation latency of digital signature generator 222 and time required to suspend operations of BIST 216 once the output of comparator 242 changes to the fault-indicating state.

In an embodiment of logic device 210 in which digital signature generator 222 is structured as an X-Compactor and comparator 242 is structured as just described, the maximum latency of digital signature generator 222 is approximately one output shift operation. This embodiment does not eliminate the need to store the responses in buffer 244 because the scan chain that outputs the fault-indicating response cannot be identified from the representative signature output by the X-Compactor.

Expected Signature Source 252

Expected signature source 252 provides an expected signature corresponding to each representative signature output by digital signature generator 222. The expected signature source provides the expected signature in response to the expected signature information received from ATE 212 via expected signature information path 238. The structure of the expected signature source is determined by the structure of the expected signature information that ATE 212 is capable of providing and the number of channels available in expected signature information path 238 to supply the expected signature information from ATE 212 to logic device under test 210.

Figure 7A:
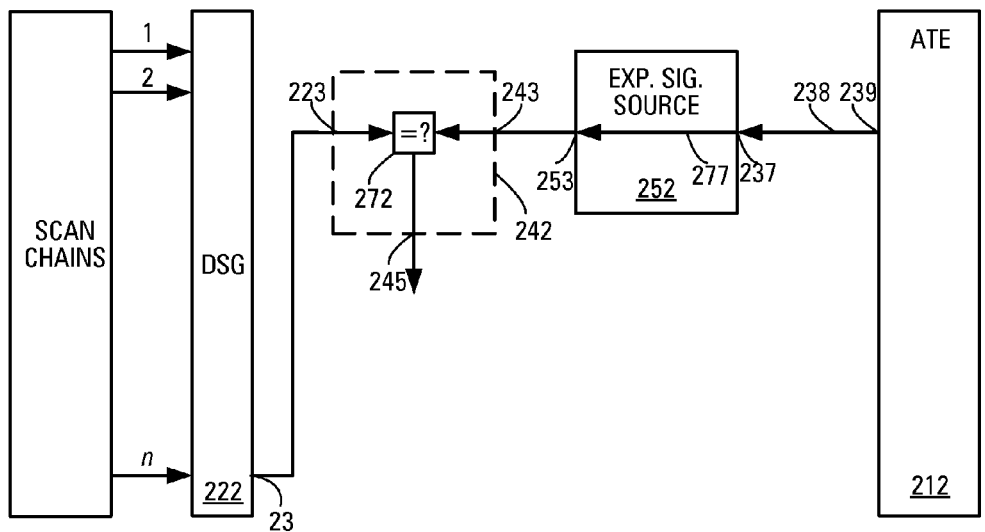
FIG. 7A is a block diagram showing an example of an expected signature source in which the representative signature and the expected signature are each a single bit and the expected signature information is used directly as the expected signature.

In one embodiment of diagnostic information collector 250, comparator 242 compares a single-bit representative signature output by digital signature generator 222 with a single-bit expected signature provided by expected signature source 252, as described above with reference to FIG. 6A. FIG. 7A is a block diagram showing an example of the expected signature source 252 of an embodiment of diagnostic information collector 250 in which digital signature generator 222 outputs a single-bit representative signature, the expected signature is a single bit and the expected signature information received from ATE 212 is used directly as the expected signature. ATE 212 provides single-bit expected signature information for each test in the test sequence via single-conductor expected signature information path 238. In this embodiment, expected signature source 252 is embodied simply as a pass-through connection 277 between signature information input 237 and the expected signature input 243 of comparator 242.

Figure 7B:
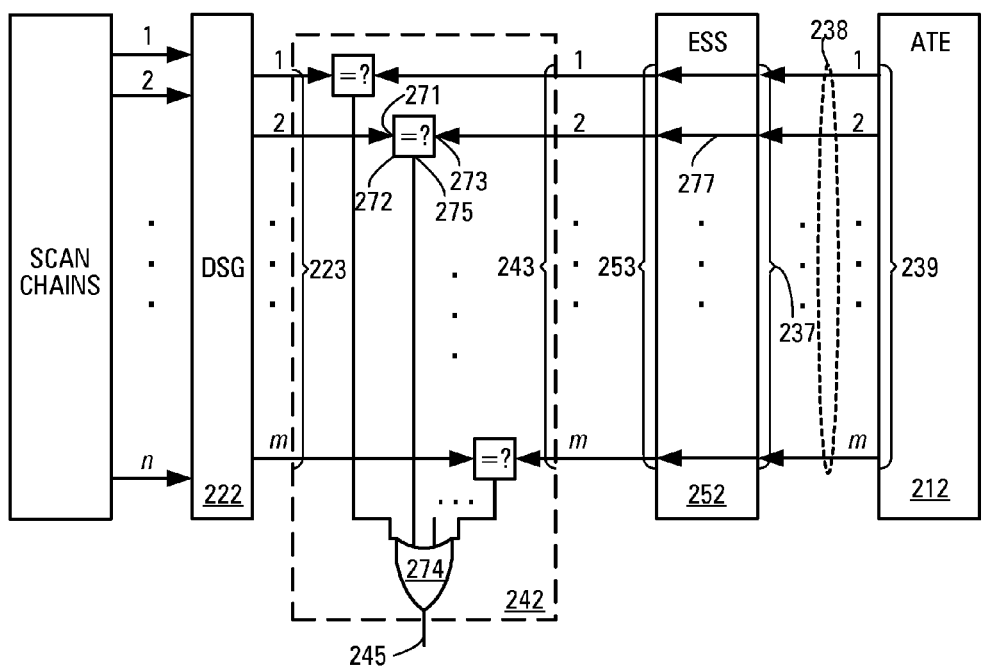
FIG. 7B is a block diagram showing an example of an expected signature source in which the representative signature and the expected signature are each a multi-bit values and the expected signature information is used directly as the expected signature.

In other embodiments of diagnostic information collector 250, comparator 242 compares a multi-bit representative signature output at taps along digital signature generator 222 with a multi-bit expected signature provided by expected signature source 252, as described above with reference to FIG. 6B. As noted above, embodiments of digital signature generator 222 structured as a multi-tap MISR or as an X-Compactor output a multi-bit representative signature. FIG. 7B is a block diagram showing a first example of the expected signature source (ESS) 252 of the above-described embodiment of diagnostic information collector 250 in which digital signature generator 222 outputs a multi-bit representative signature and the expected signature is a multi-bit expected signature. In this embodiment, ATE 212 provides a multi-bit expected signature information for each multi-bit representative signature, and the expected signature information received from ATE 212 is used directly as the expected signature. ATE 212 provides the multi-bit expected signature information via expected signature information path 238. In this embodiment, expected signature information path 238 is a multi-conductor path having one conductor for each bit of the expected signature information, and expected signature output 253 and expected signature information output 239 are each a multi-conductor output having one conductor for each bit of the expected signature. Expected signature source 252 is embodied simply as a pass-through connection between each conductor of expected signature information input 237 and the respective conductor of expected signature output 253. An exemplary pass-through connection is shown at 277. Thus, expected signature source 252 effectively provides a pass-through connection between the each conductor of expected signature information path 238 and the second input 273 of a respective single-bit comparator 272 that constitutes comparator 242. In this example, expected signature source 252 is simple in structure, but expected signature information path 238 requires a multi-conductor structure to convey the multi-bit expected signature information from ATE 212 to logic device 210. In the above-described extreme embodiment, the number of conductors in expected signature information path 238 is equal to the number of stages constituting digital signature generator 222.

Figure 7C:
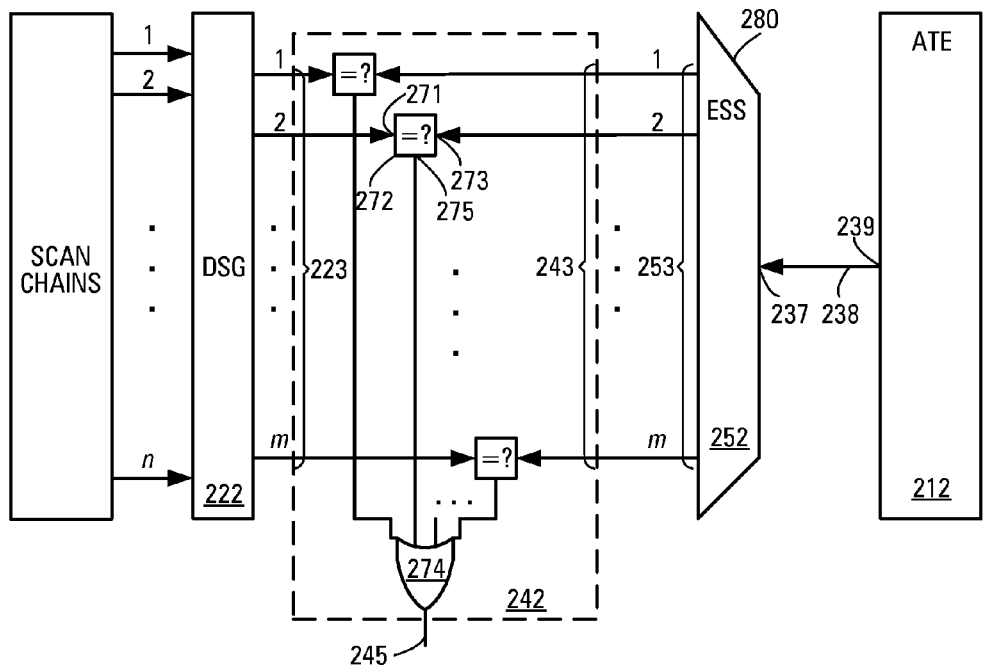
FIG. 7C is a block diagram showing an example of an expected signature source in which the representative signature and the expected signature are each multi-bit values and the expected signature information is used directly as the expected signature and is received serially.

FIG. 7C is a block diagram showing a second example of the expected signature source 252 of the above-described embodiment of diagnostic information collector 250 in which digital signature generator 222 outputs a multi-bit representative signature and the expected signature is a multi-bit expected signature. In this embodiment, ATE 212 provides multi-bit expected signature information corresponding to each representative signature, and the expected signature information received from ATE 212 is used directly as the expected signature. In this embodiment, expected signature source 252 is embodied as a demultiplexer 280. For each representative signature, ATE 212 generates multi-bit expected signature information serially and outputs such multi-bit expected signature information via a single-conductor embodiment of expected signature information path 238. To provide the expected signature information at the same rate as in the example described above with FIG. 7B in which the expected signature information path is a multi-conductor path having one conductor for each bit of the expected signature information, single-conductor expected signature information path 238 provides the expected signature information to the expected signature information input 237 of diagnostic information collector 250 at a bit rate m times the output shift frequency of scan chains 24, where m is the number of bits in the expected signature information. Demultiplexer 280 demultiplexes the serially-received expected signature information to provide the respective bit of the multi-bit expected signature to the second input 273 of each single-bit comparator 272 that constitutes comparator 242. In this example, expected signature source 252 is more complex in structure than the above-described examples, but provides a multi-bit expected signature using only a single-conductor expected signature information path 238.

Figure 7D:
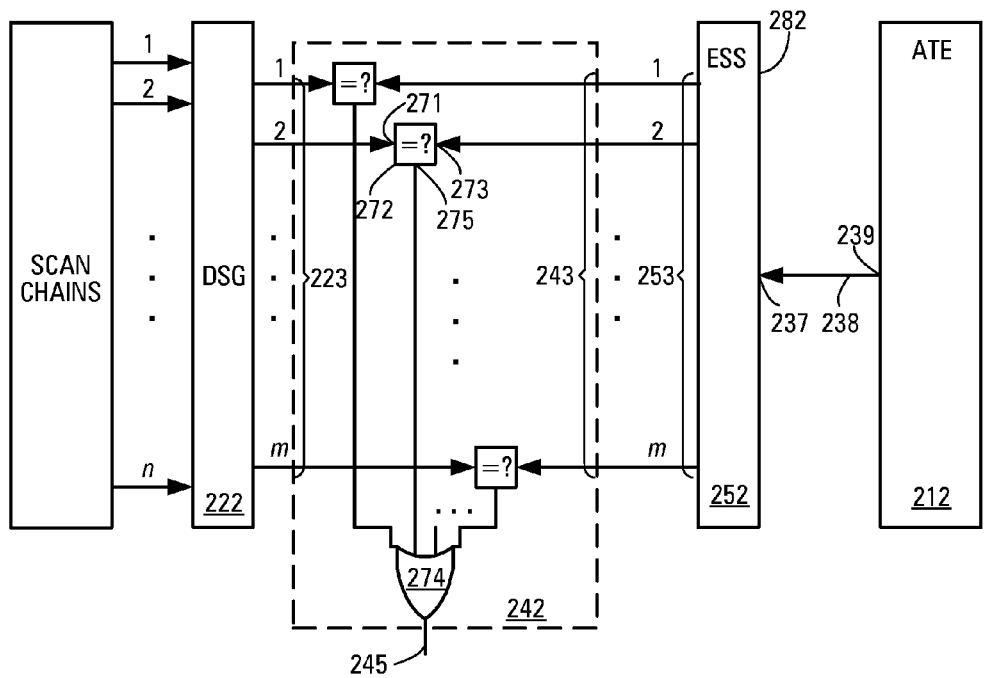
FIG. 7D is a block diagram showing an example of an expected signature source in which the representative signature and the expected signature are each multi-bit values and the expected signature source generates an expected signature corresponding to each representative signature from the expected signature information.

FIG. 7D is a block diagram showing a third example of the expected signature source of the above-described embodiment in which digital signature generator 222 outputs a multi-bit representative signature and the expected signature is a multi-bit expected signature. In this embodiment, expected signature source 252 is embodied as a state machine 282. At the start of the test sequence and after each fault is detected, ATE 212 serially provides to state machine 282 multi-bit expected signature information via a single-conductor embodiment of expected signature information path 238. Alternatively, the expected signature information may be generated or stored within expected signature source 252. In response to the expected signature information, state machine 282 generates the multi-bit expected signature corresponding to each representative signature and provides a respective bit of the multi-bit expected signature to the second input 273 of each single-bit comparator 272 that constitutes comparator 242.

In the example shown in FIG. 7D, expected signature information path 238 is used intermittently, i.e., at the beginning of the test sequence and after each fault, if any, is detected. By using multiplexers (not shown), expected signature information path 238 can be used for other purposes while logic device 210 is being tested. For example, expected signature information path 238 can additionally be used to provide fault indication path 235 or diagnostic information output path 228.

State machine 282 can also be used as expected signature source 252 in the embodiments described above with reference to FIG. 6A and FIG. 7A in which comparator 242 compares a single-bit representative signature output by digital signature generator 222 with a single-bit expected signature provided by expected signature source 252.

Buffer 244

Buffer 244 temporarily stores the responses output by scan chains 24 for a certain number of output shift operations to prevent the loss of a fault-indicating response that would otherwise occur as a result of BIST 216 continuing to operate during the maximum latency that can occur before digital signature generator 222 outputs a fault-indicating representative signature in response to receiving a fault-indicating response and the latency involved in setting ATE 212 into a state in which it can receive the stored responses including the fault-indicating response. The size of buffer 244 is determined by the rate at which scan chains 24 output the responses and the latencies just described. As noted above, configuring BIST controller 226 so that, in response to a fault-indicating representative signature, it causes BIST 216 to suspend its normal testing operations allows the size of buffer 244 to be reduced.

Also as noted above, the size of buffer 244 is minimized in embodiments in which digital signature generator 222 is structured as an X-compactor due to the low latency of this type of digital signature generator. The size of buffer 244 is also reduced in embodiments in which digital signature generator 222 is structured as multi-tap MISR, especially in embodiments in which the number of taps is large. However, these types of digital signature generator require that comparator 242 be a multi-bit comparator and that expected signature source 252 provide multi-bit expected signatures, as described above.

Implementations of logic device that attempt to reduce the size of buffer 244 and the number of pins of logic device 210 and ATE 212 used to communicate with the buffer will be described next with reference to FIGS. 8A and 8B.

Figure 8A:
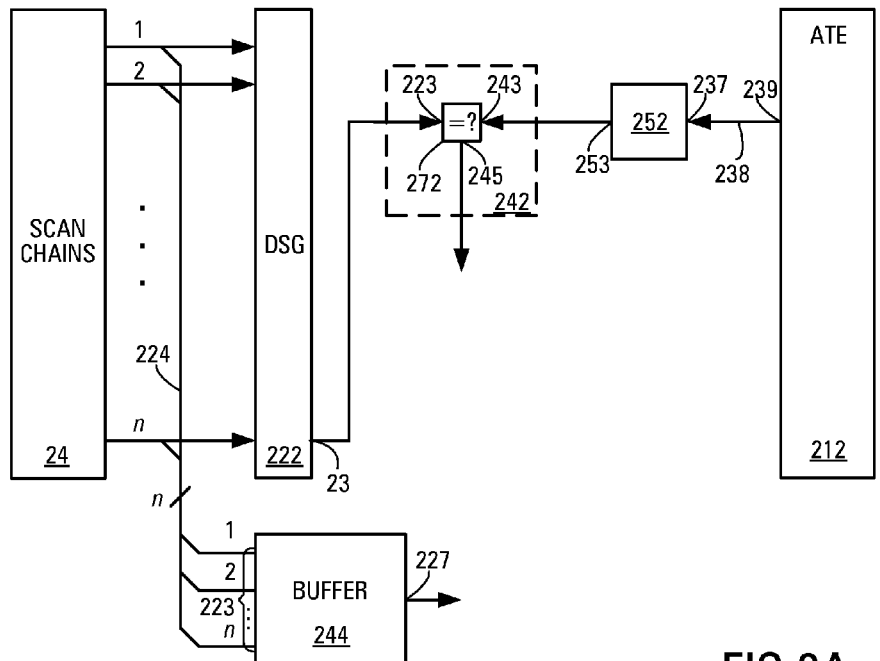
FIG. 8A is a block diagram showing an example of a simple buffer configuration that can be used in embodiments in which the number of scan chains is much smaller than the number of stages in each scan chain.
Figure 8B:
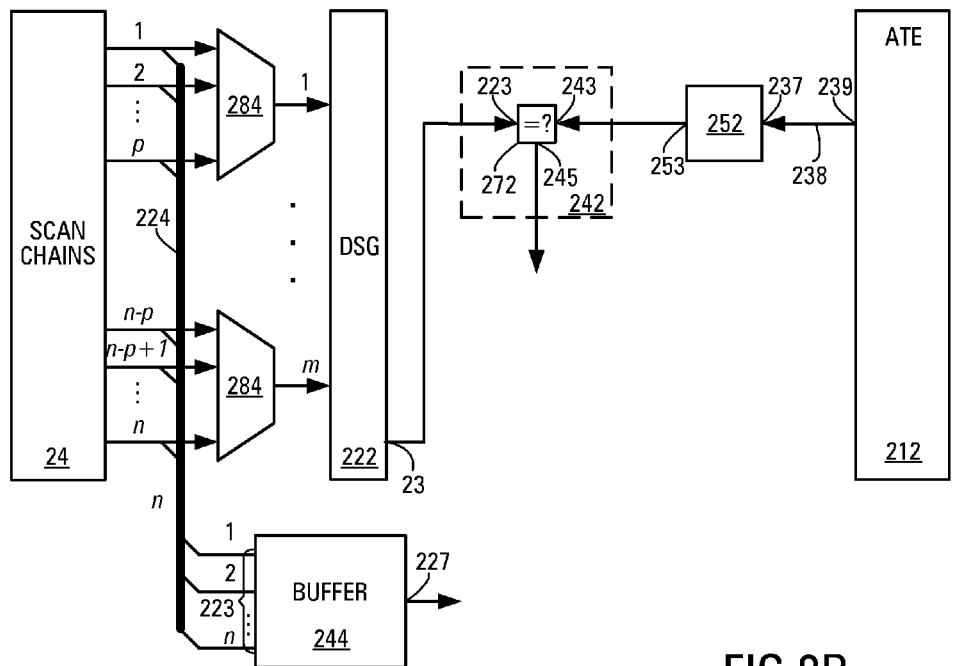
FIG. 8B is a block diagram showing an example of a buffer configuration in which multiplexers are interposed between the scan chains and the digital signature generator.

FIGS. 8A and 8B show buffer configurations for use in embodiments in which digital signature generator 222 is embodied as a multi-input shift register (MISR). The choice of buffer configuration depends on the ratio of the number of scan chains 24 and the number of stages in each scan chain. The number of stages (n) in the MISR used as digital signature generator 222 is equal to the number of scan chains. FIG. 8A shows an example of a simple configuration that can be used in embodiments in which the number of scan chains is much smaller than the number of stages in each scan chain. In this embodiment, the representative signature output by digital signature generator 222 and the expected signature output by expected signature source 252 are each a single bit, as described above with reference to FIGS. 6A and 7A. Since the number of scan chains is relatively small, the number of stages in the MISR is relatively small. Consequently, the latency of digital signature generator 222 is relatively small so that the depth of buffer 244 needed to accommodate the latency of digital signature generator 222 is relatively small despite the use of a single-bit representative signature.

In embodiments in which the number of scan chains is not small compared with the number of stages in each scan chain, the latency of digital signature generator 222 and, hence, the buffer depth, would be large if the configuration shown in FIG. 8A were used. In such embodiments, the latency of digital signature generator 222 and, hence, the depth of buffer 244 can be reduced by using a using a multi-tap MISR as digital signature generator 222, as described above. With this embodiment of digital signature generator 222, the representative signature output by digital signature generator 222 and the expected signature output by expected signature source 252 are each multi-bit values. This approach allows the depth of buffer 212 to be reduced by a factor equal to the number of bits in each representative signature. Embodiments that have multi-bit representative signatures are described above with reference to FIGS. 6B and 7B-7D.

In the embodiments described above with reference to FIGS. 6B, 7B and 7C, providing multi-bit expected signature information from ATE 212 demands a proportionate increase in the bandwidth of expected signature information path 238 used to send the expected signature information from ATE 212 to logic circuit 210. The bandwidth of expected signature information path 238 is increased by increasing the number of conductors constituting the expected signature information path, as described above with reference to FIG. 7B, by transmitting the expected signature information serially at higher bit rate, as described above with reference to FIG. 7C, or by using a combination of these techniques.

Another way to reduce the depth of buffer 244 is to multiplex the outputs of groups of the scan chains. FIG. 8B shows an example in which digital signature generator 222 is an m-input MISR, where m is an integer fraction of the number of scan chains n, and m p-input multiplexers 284 (p=n/m) are interposed between the outputs of scan chains 24 and the inputs of digital signature generator 222. The outputs of a set of p scan chains are connected to the inputs of a respective one of the multiplexers. This reduces the number of stages constituting digital signature generator 222 by a factor of p to m. Consequently, the maximum latency of digital signature generator 222 and, hence, the depth of buffer 244 are also reduced by a factor of p. To prevent the use of multiplexers 284 from reducing the operational rate of BIST 216, the output rate of multiplexers 284 and the operational rate of digital signature generator 222 should be p times the output shift frequency of scan chains 24. Additionally, the bandwidth of expected signature information path 238 should be p times that of the expected signature information path in the example described above with reference to FIG. 8A. These advantages are obtained at the expense of an increase by a factor of p in the operational speed of digital signature generator 222 and an increase by a factor of p in the bandwidth of expected signature information path 238.

In the example shown in FIG. 8B, digital signature generator 222 outputs single-bit representative signatures. In other examples, digital signature generator 222 is provided with taps along its length and generates multi-bit representative signatures that further reduce its latency, as described above.

In some embodiments, buffer 244 is embodied as a respective first in, first out shift register (not shown) connected to the output of each of the scan chains 24. The number of stages in each shift register is at least equal to the maximum latency, expressed in output shift operations of scan chains 24, of digital signature generator 222. As noted above, additional stages are typically included in the shift registers to store the responses output by the scan chains in the output shift operations performed between the output 245 of comparator 242 changing to its fault-indicating state and controller 256 temporarily stopping the operation of BIST 216.

In other embodiments, buffer 244 is embodied as random access memory (not shown) and a memory controller (not shown) that controls the operation of the random access memory. In one embodiment, during each output shift operation, the memory controller performs simultaneous write operations on memory cells (not shown) equal in number to scan chains 24 and increments the write address in a round-robin pattern so that, in each write operation, the newly-written responses overwrite the oldest responses stored in the memory. The number of memory cells constituting buffer 244 is at least that which allows a number of write operations equal to the maximum latency, expressed in output shift operations of scan chains 24, of digital signature generator 222 before responses generated earlier in the test sequence are overwritten. As noted above, additional memory cells are typically provided to store the responses output by the scan chains in the output shift operations performed between the output 245 of comparator 242 changing to its fault-indicating state and controller 256 temporarily stopping the operation of BIST 216.

In response to a read instruction from controller 256, buffer 244 outputs its contents to diagnostic information output 227 for output to ATE 212 via diagnostic information output path 228. In some embodiments, buffer 244 incorporates a multiplexer (not shown) interposed between its memory elements (memory cells or shift registers) and diagnostic information output 227. Such multiplexer multiplexes the responses read out of the memory elements in parallel to generate a serial bit stream. Outputting the responses serially at a higher bit rate allows diagnostic information output path 228 to be configured as a single conductor.

Figures 9A, 9B:
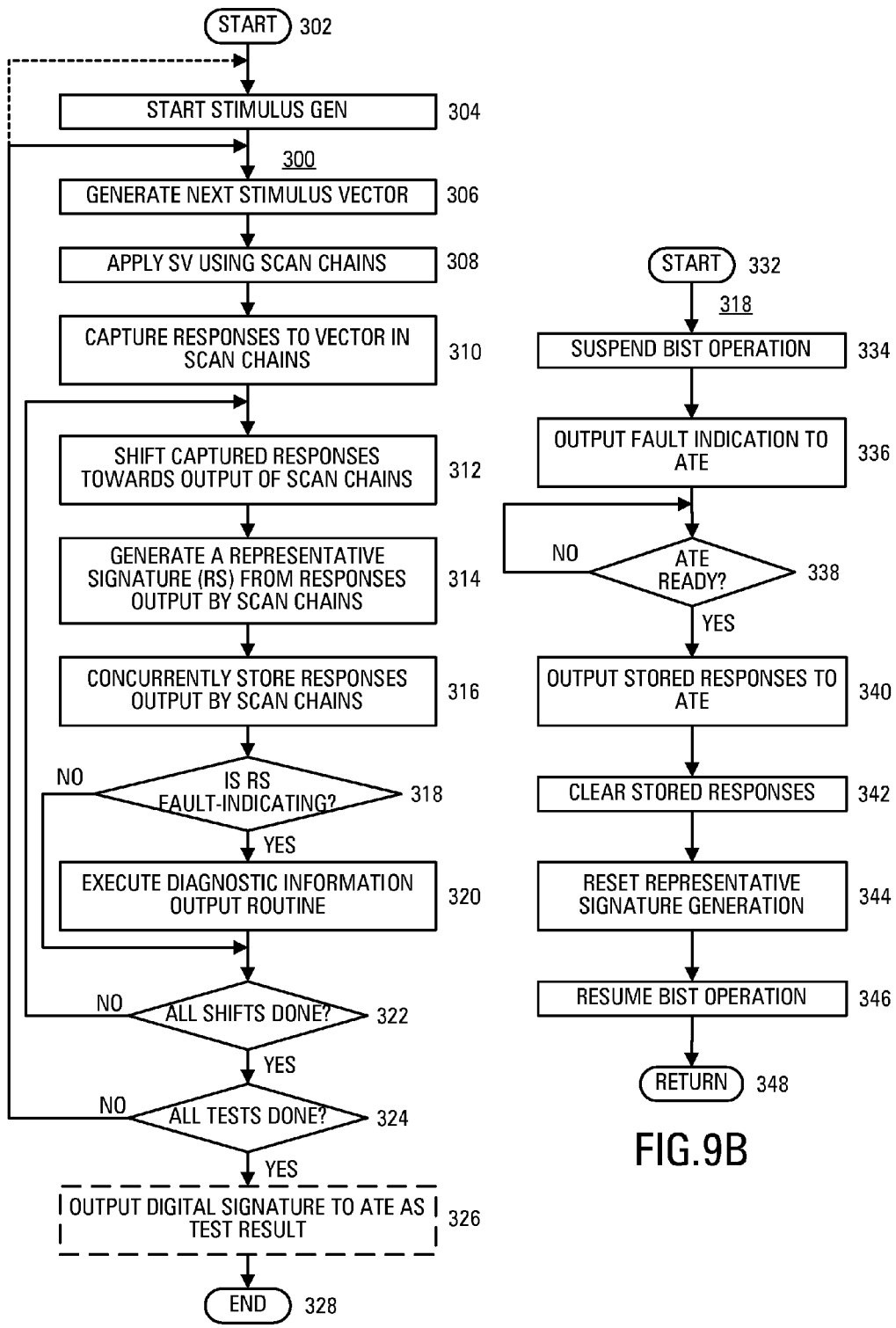
FIG. 9A is a flow chart showing an example of a first method in accordance with an embodiment of the invention for operating a logic device under test in its self-test mode.
FIG. 9B is a flow chart showing an example of a diagnostic information output routine that constitutes part of the methods shown in FIGS. 9A and 10.

FIG. 9A is a flow chart showing an example of a method 300 in accordance with an embodiment of the invention for operating logic device 210 in its self-test mode. In this embodiment, the operation of BIST 216 is suspended from the time that a fault-indicating representative signature is detected until the responses have been output to the ATE and the digital signature generator has been reset. This mode of operation minimizes the size requirements of buffer 244.

Execution begins at block 302. In block 304, stimulus generator 20 is started. In embodiments in which BIST 216 is a pseudorandom system, stimulus generator is started by initializing it with a seed received from ATE 212 at the beginning of the test sequence. In embodiments in which BIST 216 is a deterministic system, stimulus generator 20 is initialized with a new seed provided by ATE 212 at the beginning of every test in the test sequence. In such embodiment, a NO result in block 324, described below, returns execution to block 304 instead of to block 306.

In block 306, a next stimulus vector (SV) is generated. In block 308, the stimulus vector generated in block 306 is applied to logic circuits 14 by scan chains 24. In block 310, the responses generated by the logic circuits in response to the stimulus vector are captured by scan chains 24. In block 312, the responses are shifted towards the outputs of scan chains 24, resulting in the output of a response from each scan chain. In block 314, a representative signature is generated from the responses output by the scan chains. Responses output by the scan chains in previous executions of block 312 contribute to the representative signature generated in block 314. In block 316, the responses output by the scan chains in block 312 are temporarily stored concurrently with the representative signature generation performed in block 314. Concurrently, as used herein, does not require simultaneity, but the responses are stored before responses are output by the next output shift operation performed by the scan chains.

In block 318, a test is performed to determine whether the representative signature generated in block 314 is a fault-indicating representative signature, e.g., when the representative signature differs from a corresponding expected signature. A NO result advances execution to advance to block 322, described next. A YES result advances execution to block 320, in which a diagnostic information output routine is performed. The diagnostic information output routine performed in block 320 will be described below. Execution then advances to block 322, which will be described next.

A NO result in block 318 or completion of the diagnostic information output routine performed in block 320 advances execution to block 322. In block 322, a test is performed to determine whether scan chains 24 have performed the shift operations necessary to output all the responses of logic circuits 14 to the stimulus vector input applied in block 308. A NO result causes execution to return to block 312, where the next shift operation is performed. A YES result causes execution to advance to block 324.

In block 324, a test is performed to determine whether all the tests in the test sequence have been performed. A NO result causes execution to return to block 304 (deterministic embodiment) or to block 306 (pseudo-random embodiment), where execution of the next test in the test sequence is begun. A YES result causes execution to advance to optional block 326.

In optional block 326, the digital signature generated by digital signature generator 222 at the end of the test sequence is output to ATE 212 as the test result for logic device under test. ATE 212 compares the test result with an expected test result to categorize logic device under test 210 as good or bad.

Logic device under test 210 outputs the final digital signature via test result output 31 merely to maintain compatibility with existing ATE logic test routines. Block 326, test result output 31, test result path 32 and test result input 33 can be omitted in embodiments in which the ATE is capable of determining a test result for logic device under test 210 without receiving a test result from the logic device under test. In an example, BIST controller 226 provides an end-of-test indication via control path 37 to indicate the end of the test sequence to ATE 212. The ATE then categorizes logic circuit under test 210 by determining whether it received any diagnostic information while the test sequence was being performed.

FIG. 9B is a flow chart showing an example of diagnostic information output routine performed in block 320. The diagnostic information output routine begins at block 332. In block 334, operation of BIST 216 is suspended. This temporarily prevents scan chains 24 from outputting further responses. In the embodiment described above with reference to FIGS. 3 and 5, controller 256 changes the state of the suspend control signal provided to BIST controller 226. This causes BIST controller 226 to stop BIST 216 performing further testing operations.

In block 336, a fault indication, indicating that a fault-indicating representative signature has been generated in block 314 is output to ATE 212. In the embodiment described above with reference to FIGS. 3 and 5, controller 256 provides fault indication FI to ATE 212.

In block 338, a test is performed to determine whether ATE 212 is ready to receive stored responses. A NO result causes execution to return to block 338, typically after a predetermined delay (not shown). A YES result causes execution to advance to block 340.

In block 340, the stored responses are output to ATE 212 as diagnostic information. In the example described above with reference to FIGS. 3 and 5, the responses stored in buffer 244 are output from buffer 244 to ATE 212 via diagnostic information output path 228. During such output of diagnostic information, ATE 212 may provide control signals via fault indication path 235 to signal its readiness to receive such stored responses and/or to temporarily stop the output process to prevent a buffer overrun within ATE 212.

In block 342, the stored responses are cleared. In the example described above with reference to FIGS. 3 and 5, the responses stored in buffer 244 are cleared. In a buffer having a first in, first out configuration, clearing takes place automatically.

In block 344, the representative signature generation process is reset to remove the fault-indicating response that caused it to generate a fault-indicating representative signature in block 314 (FIG. 9A). In the example described above with reference to FIGS. 3 and 5, controller 256 causes corrected signature generator 254 to generate a corrected signature in response to the expected signature received from expected signature source 252. The corrected signature then overwrites or otherwise replaces at least part of the digital signature generated by digital signature generator 222 and causes the digital signature generator to output a corrected representative signature. This restores the output of comparator 242 to its non fault-indicating state. In some embodiments, the expected signature output by expected signature source 252 is used as the corrected signature.

In block 346, operation of BIST 216 is resumed. In the embodiment described above with reference to FIGS. 3 and 5, the output of comparator 242 reverting to its non fault-indicating state causes controller 256 to restore the suspend control signal provided to BIST controller 226 to its original (not suspend) state. This causes BIST controller 226 to cause BIST 216 to resume its normal testing operations.

Execution returns to the main routine in block 348.

Figure 10:
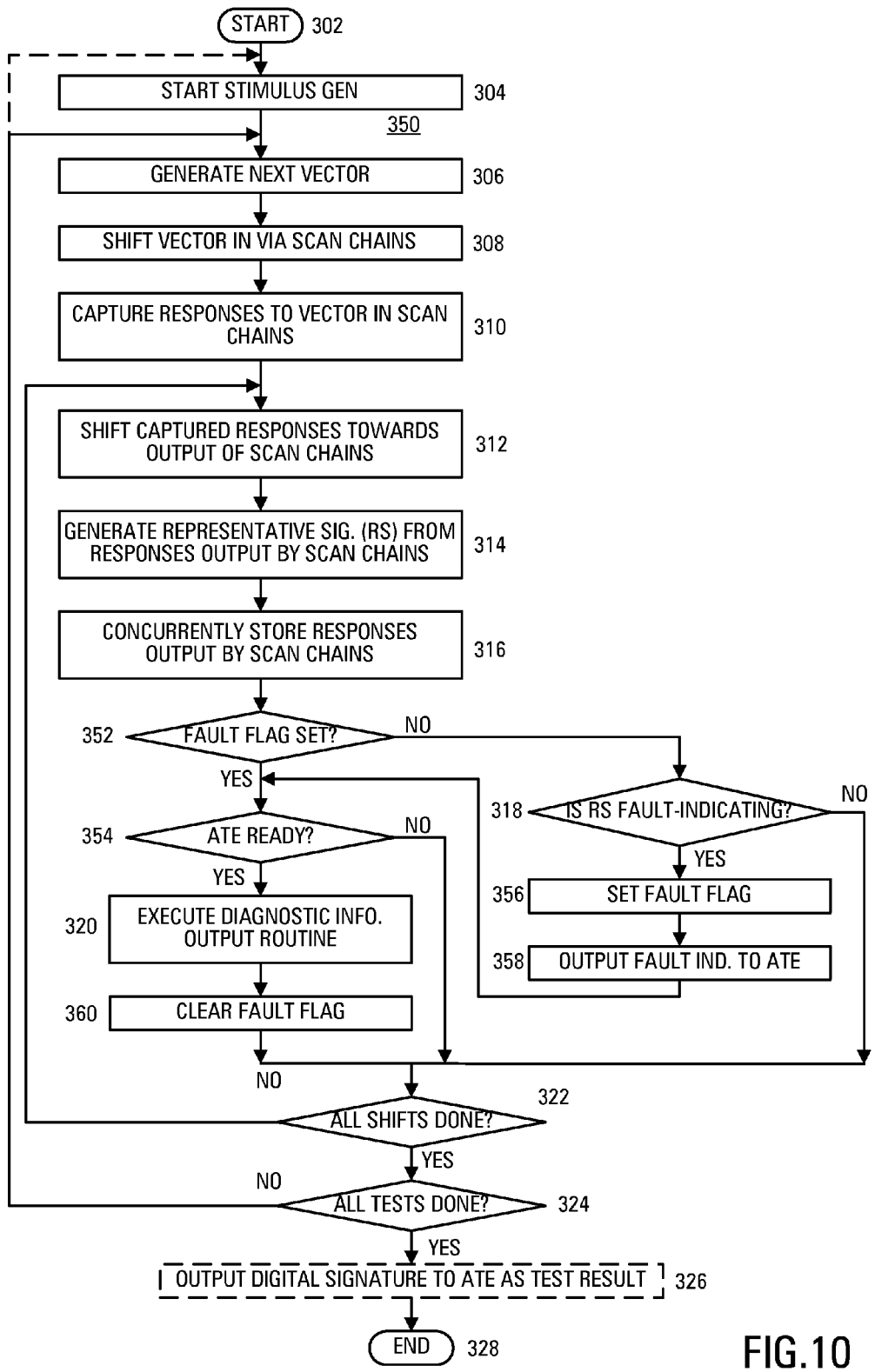
FIG. 10 is a flow chart showing an example of a second method in accordance with an embodiment of the invention for operating a logic device under test in its self-test mode.

FIG. 10 is a flow chart showing an example of a method 350 in accordance with an embodiment of the invention for operating logic device 210 in its self-test mode. In this embodiment, BIST 216 continues to operate to shift responses out of the scan chains until ATE 212 is ready to receive the stored responses. Once ATE 212 indicates that it is ready to receive the stored responses, BIST 216 suspends operation while the stored responses are output to the ATE and representative signature generation is reset.

Blocks 302, 304, 306, 308, 310, 312, 314 and 316 are executed as described above with reference to FIG. 9A and these blocks will not be described again in detail here. In method 350, once the representative signature has been generated in block 314 and the responses output from scan chains 24 have been stored in block 316, execution advances to block 352.

In block 352, a test is performed to determine whether a fault flag has been set. The fault flag being set indicates that a fault-indicating representative signature has been generated in block 314 after a previous output shift operation of scan chains 24, but ATE 212 has not yet indicated its readiness to receive the stored responses. A YES result advances execution to block 354, described below. A NO result (no fault flag set) causes execution to advance to block 318.

In block 318, a test is performed to determine whether the representative signature generated in block 314 is a fault-indicating representative signature. A NO result causes execution to advance to block 322, described below. A YES result causes execution to advance to block 356.

In block 356, the fault flag is set. In block 358, a fault indication is output to ATE 212. The fault indication indicates that a fault-indicating representative signature has been generated in block 314, and that responses usable as diagnostic information are ready to be output to ATE 212. Execution then advances to block 358, described below.

A YES result in block 352 (fault flag set) causes execution to advance to block 354. In block 354, a test is performed to determine whether the ATE is ready to receive responses. A NO result causes execution to advance to block 322, described below. A YES result, indicating that the ATE is ready, causes execution to advance to block 320, where the diagnostic information output routine described above with reference to FIG. 9B is performed. The diagnostic information output routine outputs the responses stored in at least one execution of block 316 to ATE 212. After the diagnostic information output routine 320 has been executed, execution advances to block 360, described next.

In block 360, the fault flag set in block 356 is cleared. Execution then advances to block 322, described next.

NO results in blocks 318 and 354 and execution of block 360 cause execution to advance to block 322. In block 322, a test is performed to determine whether scan chains 24 have performed the shift operations necessary to output all the responses of logic circuits 14 to the stimulus vector input applied in block 308. A NO result causes execution to return to block 312, where the next output shift operation is performed. A YES result causes execution to advance to block 324.

In block 324, a test is performed to determine whether all the tests in the test sequence have been performed. A NO result causes execution to return to block 304 (deterministic embodiment) or to block 306 (pseudo-random embodiment), where execution of the next test in the test sequence is begun. A YES result causes execution to advance to optional block 326, described above with reference to FIG. 9A. Execution ends at block 328.

This disclosure describes the invention in detail using illustrative embodiments. However, the invention defined by the appended claims is not limited to the precise embodiments described.

We claim:

1. A method of obtaining diagnostic information from a logic device comprising logic circuits and a built-in self-test system (BIST) comprising scan chains, the method comprising:
    using the scan chains, applying a stimulus vector to the logic circuits, capturing responses of the logic circuits to the stimulus vector and shifting the captured responses toward outputs of the scan chains;
    generating a representative signature representing captured responses output by the scan chains;
    concurrently with the generating, temporarily storing the captured responses output by the scan chains such that no more than a most-recently output subset of the captured responses is stored, the subset consisting of fewer than all of the captured responses;
    determining whether the representative signature is a fault-indicating representative signature; and
    when the representative signature is a fault-indicating representative signature, outputting at least some of the temporarily stored captured responses.

2. The method of claim 1, in which:
    the generating introduces latency; and
    the maximum number of responses temporarily stored depends on the latency.

3. The method of claim 1, additionally comprising, when the representative signature is a fault-indicating representative signature, resetting the generating.

4. The method of claim 1, additionally comprising, when the representative signature is a fault-indicating representative signature, suspending operation of the BIST.

5. The method of claim 1, additionally comprising:
    connecting the logic device to automatic test equipment; and
    when the determining determines that the representative signature is a fault- indicating representative signature, causing the automatic test equipment to receive the at least some of the temporarily stored captured responses.

6. The method of claim 5, in which the causing comprises providing an interrupt to the automatic test equipment.

7. The method of claim 5, additionally comprising waiting for the ATE to indicate readiness to receive the temporarily stored captured responses.

8. The method of claim 7, additionally comprising, during the wait for the ATE to indicate readiness to receive the output responses, continuing to:
    shift the captured responses towards the outputs of the scan chains, generate the representative signature, and temporarily store the captured responses output by the scan chains.

9. The method of claim 1, in which the determining comprises comparing the representative signature with a corresponding expected signature.

10. The method of claim 9, in which the comparing comprises performing a multi-bit comparison.

11. The method of claim 10, in which:
    the representative signature and the corresponding expected signature are multi-bit values; and
    the comparing comprises receiving the multi-bit expected signature serially.

12. The method of claim 9, in which the comparing comprises generating the corresponding expected signature within the logic device.

13. A device, comprising:
    logic circuits;
    a built-in self-test system (BIST) comprising a digital signature generator and scan chains coupled to the logic circuits, the scan chains having outputs coupled to the digital signature generator, the scan chains operable to apply a stimulus vector to the logic circuits, to capture responses of the logic circuit to the stimulus vector and to shift the captured responses toward the outputs of the scan chains, the digital signature generator operable to output a representative signature representing the captured responses output by the scan chains; and
    a diagnostic information collector, comprising:
        a comparator comprising an output and a representative signature input, the representative signature input coupled to the digital signature generator, the output changing to a fault-indicating state when the representative signature is a fault-indicating representative signature, and
        a buffer coupled to the outputs of the scan chains and operable concurrently with the digital signature generator to store temporarily the captured responses output by the scan chains such that a most-recently stored subset of the captured responses output by the scan chains is stored therein, the subset consisting of fewer than all of the captured responses generated in response to the stimulus vector, the buffer additionally operable in response to the fault-indicating state at the output of the comparator to output at least some of the temporarily stored captured responses as diagnostic information.

14. The device of claim 13, in which:
    the comparator additionally comprises an expected signature input; and
    the device additionally comprises an expected signature source coupled to the expected signature input of the comparator.

15. The device of claim 14, in which:
    the digital signature generator generates multi-bit representative signatures and the expected signature source provides corresponding multi-bit expected signatures; and the expected signature source comprises an input at which multi-bit expected signature information is received serially.

16. The device of claim 14, in which the expected signature source comprises an expected signature generator internal to the logic circuits.

17. The device of claim 13, in which:
the output of the comparator is additionally coupled to the digital signature generator; and
the fault-indicating state at the output of the comparator causes the digital signature generator to be reset to generate a non fault-indicating representative signature.

18. The device of claim 13, in which:
the output of the comparator is coupled to the BIST; and
the fault-indicating state at the output of the comparator causes the BIST to suspend operation.

19. The device of claim 13, additionally comprising multiplexers interposed between the outputs of the scan chains and the digital signature generator.

20. The device of claim 13, in which the digital signature generator comprises one of a single output multiple-input shift register, a multiple-input shift register having multiple output taps, and an X-Compactor.

21. A system, comprising:
automatic test equipment; and
a logic device under test connected to the automatic test equipment, the logic device comprising:
logic circuits,
a built-in self-test system (BIST) comprising a digital signature generator and scan chains coupled to the logic circuits, the scan chains having outputs coupled to the digital signature generator, the scan chains operable to shift a stimulus vector into the logic circuits, to capture responses of the logic circuit to the stimulus vector and to shift the captured responses toward the outputs of the scan chains, the digital signature generator operable to generate a representative signature representing the captured responses output by the scan chains, and
a diagnostic information collector, comprising:
a comparator comprising an output and a representative signature input, the representative signature input coupled to the digital signature generator, the output changing to a fault-indicating state when the representative signature is a fault-indicating representative signature; and
a buffer coupled to the outputs of the scan chains and operable concurrently with the digital signature generator to store temporarily the captured responses output by the scan chains such that a most-recently stored subset of the captured responses output by the scan chains is stored therein, the subset consisting of fewer than all of the captured responses generated in response to the stimulus vector, the buffer additionally operable in response to the fault-indicating state at the output of the comparator to output at least some of the temporarily stored captured responses as diagnostic information.

22. The device of claim 21, in which the fault-indicating state of the output of the comparator causes the automatic test equipment to receive the responses output from the buffer.

* * * * *